United States Patent
Mimura et al.

(10) Patent No.: US 7,940,841 B2
(45) Date of Patent: May 10, 2011

(54) MODULATING CIRCUIT, TRANSMITTING APPARATUS USING THE SAME, RECEIVING APPARATUS AND COMMUNICATION SYSTEM

(75) Inventors: Masahiro Mimura, Tokyo (JP); Kazuaki Takahashi, Tokyo (JP); Suguru Fujita, Tokyo (JP); Yoshinori Kunieda, Tokyo (JP); Noriyuki Ueki, Tokyo (JP)

(73) Assignee: Panasonic Corporation, Osaka (JP)

( * ) Notice: Subject to any disclaimer, the term of this patent is extended or adjusted under 35 U.S.C. 154(b) by 927 days.

(21) Appl. No.: 11/718,570

(22) PCT Filed: Nov. 4, 2005

(86) PCT No.: PCT/JP2005/020273
§ 371 (c)(1),
(2), (4) Date: May 3, 2007

(87) PCT Pub. No.: WO2006/051735
PCT Pub. Date: May 18, 2006

(65) Prior Publication Data
US 2007/0297487 A1    Dec. 27, 2007

(30) Foreign Application Priority Data

Nov. 9, 2004 (JP) ................................. 2004-324841
Mar. 30, 2005 (JP) ................................. 2005-097423
Oct. 25, 2005 (JP) ................................. 2005-309381

(51) Int. Cl.
*H03K 7/04* (2006.01)
(52) U.S. Cl. .................... 375/239; 375/237; 375/238
(58) Field of Classification Search .......... 375/239, 375/237, 238
See application file for complete search history.

(56) References Cited

U.S. PATENT DOCUMENTS

| 6,686,879 | B2 * | 2/2004 | Shattil ............................. 342/367 |
| 7,706,452 | B2 | 4/2010 | Fujita et al. |
| 2004/0257167 | A1 * | 12/2004 | Kim et al. ....................... 332/112 |

(Continued)

FOREIGN PATENT DOCUMENTS

CN    200580037864    4/2010
(Continued)

OTHER PUBLICATIONS

International Search Report for corresponding International PCT Application No. PCT/JP2005/020273 dated Dec. 13, 2005.

(Continued)

*Primary Examiner* — Shuwang Liu
*Assistant Examiner* — Kabir A Timory
(74) *Attorney, Agent, or Firm* — RatnerPrestia

(57) ABSTRACT

A communication system includes a modulating circuit to increase the amount of information to be transmitted, a transmitting apparatus capable of easily generating a desired waveform even for any very short wavelets, a receiving apparatus capable of easily separating wavelets even if the intervals thereof are narrow. The modulating circuit includes clock generating, transmission signal generating, control signal generating, delay and wavelet generating parts. The clock generating part generates a clock signal at predetermined time interval "Tp". The transmission signal generating part generates a transmission signal at interval "Tp". The control signal generating part outputs a control signal of a predetermined duration based on the clock signal. The delay part generates the control signal as a delay signal that has been delayed by a delay amount based on the transmission signal. The wavelet generating part generates a wavelet at the generation timing of the delay signal.

8 Claims, 20 Drawing Sheets

U.S. PATENT DOCUMENTS

| | | |
|---|---|---|
| 2006/0045177 A1 | 3/2006 | Kurashima et al. |
| 2006/0140249 A1 | 6/2006 | Kohno |

FOREIGN PATENT DOCUMENTS

| | | |
|---|---|---|
| JP | 10-224192 A | 8/1998 |
| JP | 2003-051356 | 2/2003 |
| JP | 2003-087220 | 3/2003 |
| JP | 2003-101509 | 4/2003 |
| JP | 2003-513501 | 4/2003 |
| JP | 2005-333615 A | 12/2005 |
| JP | 2006-094456 A | 4/2006 |
| JP | 2005-309381 | 7/2010 |
| WO | WO 2004/077775 A1 | 9/2004 |

OTHER PUBLICATIONS

Siwiak, K., "Ultra-Wide Band Radio: Introducing a New Technology", Vehicular Technology Conference, 2001. VTC2001 Spring. IEEE VTS 53$^{rd}$, May 9, 2001, pp. 1088 to 1093.

Buchegger T., Ossberger, G., Reisenzahn, A., Stelzer, A., Spring, A., Pulse Delay Techniques for PPM Impulse Radio Transmitters, Ultra Wideband Systems and Technologies, 2003 IEEE Conference, Nov. 19, 2003, pp. 37-41.

Bagga, S., Serdijn, W., Long, J., "A PPM Gaussian Monocycle Transmitter for Ultra-Wideband Communications", Ultra Wideband Systems, 2004. Joint with Conference on Ultra-wideband Systems and Technologies.. Joint UWBST & UWUWBS. 2004 International Workshop, May 21, 2004, pp. 130-134.

* cited by examiner

Move wavelet by not less than wavelet width

Move wavelet by not more than wavelet width

MODULATING CIRCUIT, TRANSMITTING APPARATUS USING THE SAME, RECEIVING APPARATUS AND COMMUNICATION SYSTEM

THIS APPLICATION IS A NATIONAL PHASE APPLICATION OF PCT INTERNATIONAL APPLICATION NO. PCT/JP2005/020273 FILED NOV. 4, 2005.

TECHNICAL FIELD

The present invention relates to a modulating circuit used mainly in pulse wireless communication, a transmitting apparatus using the same, a receiving apparatus and a communication system.

BACKGROUND ART

In addition to the rapid spread of wireless LAN equipment represented by IEEE 802.11b, by wirelessly interconnecting AV equipment or personal computers, a seamless network is expected to be established in the society. Under such circumstances, establishment of technologies for realizing small size and high-speed data transmitting apparatuses, receiving apparatuses and communication systems at a low cost has been urgently required.

As one of such technologies, much attention has been focused on a communication method called Ultra Wide Band (hereinafter, referred to as "UWB") using a pulse modulation signal.

As a conventional transmitting apparatus used in pulse wireless communication, for example, a configuration described in Japanese Translation of PCT Publication No. 2003-513501 is known. FIG. 26 shows a conventional pulse generation circuit described in Japanese Translation of PCT Publication No. 2003-513501.

A pulse generating circuit shown in FIG. 26 includes analog waveform generating circuit 5801 for generating an arbitrary analog waveform signal, inductor 5802 and circuit 5803 including a negative resistance element having a stable region and an unstable region. Circuit 5803 including a negative resistance element changes its operation state into a stable region and an unstable region in response to the analog waveform signal and oscillates in the unstable region. Thereby, one pulse of the analog waveform signal is split into a plurality of short pulses so as to obtain a wavelet signal as a modulation signal. A wavelet is a momentarily existing AC wave.

FIG. 27 is a block diagram showing a configuration of a conventional transmitting apparatus. This conventional transmitting apparatus 6213 includes first to fourth pulse generators 6203 to 6206. Pulses generated by pulse generators 6203 to 6206 based on signals from pulse source 6201 and highest order unit 6202 are orthogonal to each other. As the pulses that are orthogonal to each other, modified Hermite orthogonal pulses are used. Pulse selector/synthesizer 6207 selects and synthesizes orthogonal pulses based on data input. A multiplexed signal is amplified by amplifier 6209 in transmitting unit 6208 and transmitted via antenna 6210. A conventional receiving apparatus (not shown) uses the orthogonality of the pulses and separates them, thereby separating and demodulating the multiplexed signal. The above-mentioned configuration is disclosed in, for example, Japanese Patent Unexamined Publication No. 2003-87220.

FIG. 28 shows a modulation waveform of a conventional transmitting apparatus that is different from that of FIG. 27. In the conventional example shown in FIG. 27, by allowing pulses to be orthogonal to each other, the information amount per unit time is increased. In this conventional example, by giving information to both a pulse position and a phase thereof, the information amount is increased. In FIG. 28, "information (BIP)" represents a content providing Bi-Phase modulation, "information (PPM)" represents a content providing pulse position modulation, and "diffusion" represents a content providing diffusion processing, respectively. A "waveform" shows a waveform provided with them. The above-mentioned conventional configuration is disclosed in, for example, Japanese Patent Unexamined Publication No. 2003-101509.

However, in the conventional configuration described in Japanese Translation of PCT Publication No. 2003-513501, since information is conveyed by PWM (Pulse Width Modulation), which converts an analog waveform signal into a wavelet corresponding to the duration of the analog waveform signal, the increase in the amount of information to be transmitted leads to the increase of the width of the wavelet, which may make it difficult to increase the density of the amount of information to be conveyed.

In the conventional configuration described in Japanese Patent Unexamined Publication No. 2003-87220, since the transmitting apparatus requires complex pulse waveform generation, it may be difficult to generate a desired waveform in a very short wavelet having a wavelet width of less than 1 ns. In order to achieve a very short wavelet, a complex circuit configuration is required. Thus, the cost rises and power consumption may be increased. Meanwhile, in the conventional configuration described in Japanese Patent Unexamined Publication No. 2003-101509, when the interval of wavelets is made extremely narrow with respect to the width of the wavelet, it may be difficult to separate the wavelets in the receiving apparatus, the transmitting apparatus cannot allow the intervals of wavelets to be extremely narrow. Thus, it may be difficult to improve the communication speed.

SUMMARY OF THE INVENTION

The present invention provides a modulating circuit that is configured with a simple structure so as to increase the amount of information to be transmitted; a transmitting apparatus capable of easily generating a desired waveform even for any very short wavelets by carrying out correlation calculation and capable of realizing small size, low power consumption and low cost; a receiving apparatus capable of easily separating wavelets even if the intervals of wavelets are narrow and improving the communication speed; and a communication system configured by such apparatuses.

The modulating circuit of the present invention includes a clock generating part, a transmission signal generating part, a control signal generating part, a delay part and a wavelet generating part. The clock generating part generates a clock signal at a predetermined time interval "Tp". The transmission signal generating part generates a transmission signal at the predetermined time interval "Tp". The control signal generating part outputs a control signal having a predetermined duration based on the clock signal. The delay part generates the control signal as a delay signal that has been delayed by a delay amount based on the transmission signal. The wavelet generating part generates a wavelet at generation timing of the delay signal.

According to this configuration, a wavelet signal is generated by a delayed amount controlled by an input signal and the delayed wavelet signal is used instead of a conventional analog signal. Thus, it is possible to increase the amount of information to be transmitted with a simple configuration.

Furthermore, in the modulating circuit of the present invention, the delay amount in the delay part may have a half the period of the central frequency of the wavelet generated in the wavelet generating part. This configuration makes it possible to increase the amount of information to be transmitted with a simple configuration.

Furthermore, in the modulating circuit of the present invention, the delay part may include a delay element for delaying the control signal and a first switch circuit for switching between the delay signal by the delay element and the control signal in response to the transmission signal. This configuration makes it possible to achieve long distance communication and reduction of power consumption simultaneously by adaptive control.

The transmitting apparatus of the present invention has a configuration including a modulating circuit described in any of the above and carrying out wireless communication in which the width of the wavelet is increased when long distance communication is required and the width of the wavelet is reduced when the reduction of power consumption is required. This configuration makes it possible to achieve long distance communication and reduction of power consumption simultaneously.

Furthermore, the transmitting apparatus of the present invention may have a configuration including a modulating circuit described in any of the above and carrying out wireless communication in which the width of the wavelet is increased when synchronization at an initial time of communication is established and the width of the wavelet is reduced when data transmission is carried out after synchronization is established. This configuration makes it possible to achieve long distance communication and reduction of power consumption simultaneously.

Furthermore, the transmitting apparatus of the present invention may have a configuration including a modulating circuit that is a pulse position modulating circuit for making a position change of a wavelet with a time shorter than the width of the wavelet and a transmission output part for transmitting a signal from the pulse position modulating circuit. This configuration makes it possible to easily generate a desired waveform even for any very short wavelets and realize a transmitting apparatus having a small size, low power consumption and low cost.

Furthermore, the transmitting apparatus of the present invention may be configured so that a waveform converting circuit for converting wireless communication data into a wavelet is disposed to an input signal to the pulse position modulating circuit or disposed to an output signal from the pulse position modulating circuit. This configuration makes it possible to easily generate a desired waveform even for any very short pulses and realize a transmitting apparatus having a small size, low power consumption and low cost.

Furthermore, the transmitting apparatus of the present invention may have a configuration in which the waveform converting circuit includes a differentiating circuit for differentiating an input signal and a multiplying circuit for multiplying an input signal. This configuration makes it possible to easily generate a desired waveform even for any very short pulses.

Furthermore, in the transmitting apparatus of the present invention, the waveform converting circuit may include at least one or more wavelet generating circuits for generating a wavelet and a second switch circuit for switching signals from the at least one or more wavelet generating circuits. In this configuration, a signal is output from the second switch circuit when a signal from the pulse position modulating circuit is input. This configuration makes it possible to easily generate a desired waveform even for any very short pulses.

Furthermore, the transmitting apparatus of the present invention may have a configuration in which the waveform converting circuit includes at least one or more wavelet generating circuits for generating a wavelet and a mixing circuit for mixing signals from the at least one or more wavelet generating circuits. In this configuration, a signal is output from the mixing circuit when the signal from the pulse position modulating circuit is input. This configuration makes it possible to easily generate a desired waveform even for any very short wavelets.

Furthermore, the transmitting apparatus of the present invention may have a configuration in which the waveform converting circuit includes a wavelet generating circuit for generating a wavelet and enabling the start and termination of oscillation to be directly controlled. In this configuration, when a signal from the pulse position modulating circuit is input, a signal is output from the wavelet generating circuit. This configuration makes it possible to easily generate a desired waveform even for any very short wavelets.

Furthermore, the transmitting apparatus of the present invention may have a configuration in which the waveform converting circuit includes a waveform shaping circuit for shaping a waveform and an output of the waveform converting circuit is a waveform that has passed through the waveform shaping circuit. This configuration makes it possible to easily generate a desired waveform even for any very short wavelets.

Furthermore, the transmitting apparatus of the present invention may have a configuration in which a position change time applied in the pulse position modulating circuit is an odd multiple of $\frac{1}{2}$ period of a period in the central frequency of the wavelet of the waveform converting circuit. With this configuration, a desired waveform, which allows easy binary determination at the receiving side, can be easily generated even for any very short wavelets.

Furthermore, in the transmitting apparatus of the present invention, a position change time applied in the pulse position modulating circuit may be 1/m (m is an integer of 2 or more) of the period in the central frequency of the wavelet generated in the pulse generating part. With this configuration, by making the amount of information to be transmitted per one wavelet to be m times by m-value phase modulation, the amount of information to be transmitted can be increased.

The receiving apparatus of the present invention includes a correlation signal generating circuit, a waveform converting circuit and a correlation circuit. The correlation signal generating circuit generates a correlation signal correlated with the received signal. The waveform converting circuit converts a correlation signal generated by a correlation signal generating circuit into a wavelet and outputs the converted correlation signal. The correlation circuit outputs a correlation signal by multiplying the received signal by the converted correlation signal. This configuration makes it possible to separate wavelets easily. Thus, the communication speed can be improved easily.

Furthermore, the receiving apparatus of the present invention may have a configuration in which the waveform converting circuit includes a differentiating circuit for differentiating a waveform and a multiplying circuit for multiplying a waveform. This configuration makes it possible to separate wavelets easily. Thus, the communication speed can be improved easily.

Furthermore, the receiving apparatus of the present invention may have a configuration in which the waveform converting circuit includes at least one or more wavelet generating circuits for generating a wavelet and a third switch circuit for switching signals from the at least one or more wavelet generating circuits. In this configuration, when a signal from the correlation signal generating circuit is input, a signal is output from the third switch circuit. This configuration makes it possible to separate wavelets easily. Thus, the communication speed can be improved easily.

Furthermore, the receiving apparatus of the present invention may have a configuration in which the waveform converting circuit includes at least one or more wavelet generating circuits for generating a wavelet and a mixing circuit for mixing signals from the at least one or more wavelet generating circuits. In this configuration, when a signal from the correlation signal generating circuit is input, a signal may be output from the mixing circuit. This configuration makes it possible to separate wavelets easily. Thus, the communication speed can be improved easily.

Furthermore, the receiving apparatus of the present invention may have a configuration in which the waveform converting circuit includes a wavelet generating circuit for generating a wavelet and enabling the start and termination of oscillation to be directly controlled. In this configuration, when a signal from the correlation signal generating circuit is input, a signal is output from the wavelet generating circuit. This configuration makes it possible to separate wavelets easily. Thus, the communication speed can be improved easily.

Furthermore, the receiving apparatus of the present invention may have a configuration in which the signal output from the waveform converting circuit has 1/n (n is an integer) of the frequency converted by a circuit for wavelet conversion in the transmitting apparatus that is a transmitting source of the received signal. This configuration makes it possible to separate wavelets easily. Binary determination can be easily realized.

Furthermore, the receiving apparatus of the present invention may have a configuration in which the n is odd. This configuration makes it possible to separate wavelets easily. Binary determination can be easily realized.

Furthermore, the receiving apparatus of the present invention may have a configuration in which the waveform converting circuit includes a waveform shaping circuit for shaping a waveform and an output of the waveform converting circuit has a waveform that has passed through the waveform shaping circuit. This configuration makes it possible to separate wavelets easily. The communication speed can be easily improved.

Furthermore, the receiving apparatus of the present invention may have a configuration in which a converted correlation signal is a signal with a constant pulse-repetition period. This configuration makes it possible to separate wavelets easily. The communication speed can be easily improved.

Furthermore, the receiving apparatus of the present invention may include a dividing circuit for dividing the received signal into at least two signals, and a pulse position detection circuit for detecting a wavelet position from the amplitude of the signal divided by the dividing circuit. In this configuration, based on the wavelet position detected by the pulse position detecting circuit, the correlation signal generating circuit may determine the generation timing of the correlation signal. With this configuration, it is possible to determine correlation signal generation timing easily and to improve the communication speed.

Furthermore, the receiving apparatus of the present invention may have a configuration including an integrator for integrating the correlation signal for an arbitrary time and determine the received data by using an electric power value of the correlation signal integrated by the integrator. With this configuration, it is possible to realize the determination of the received data.

Furthermore, the receiving apparatus of the present invention may have a configuration in which a correlation signal input into the integrator is a signal that has passed through a filter circuit for extracting an arbitrary frequency band. With such a configuration, by the output electric power of a certain frequency component, received data can be determined easily.

Figure 1:
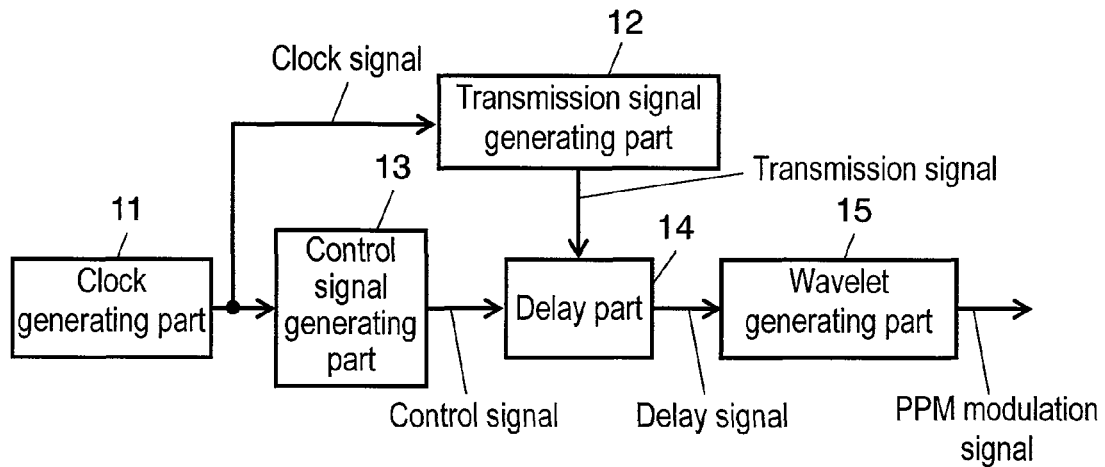
FIG. 1 is a block diagram showing a configuration of a modulating circuit by a PPM modulation in accordance with a first exemplary embodiment of the present invention.

REFERENCE MARKS IN THE DRAWINGS 11 clock generating part
12 transport signal generating part
13 control signal generating part
14 delay part
15 wavelet generating part
21 delay element
22 switch (first switch circuit)
31 inductor
32 tunnel diode
33 resistance element
71 control signal width control part
82 communication system
83 transmitting apparatus
84 receiving apparatus
103, 207 data converting part
104 PPM modulating circuit (pulse position modulating circuit)
105 transmission output part
106, 204, 205 antenna
110 wavelet shortening circuit
111, 903, 904 delay device
201, 503 correlation signal generating circuit
202, 203 waveform converting circuit
206 correlation circuit (including a filter circuit)
302 differentiating circuit
303 multiplying circuit
304 capacitor
305 transistor multiplier
402 mixer (mixing circuit)
403 signal source (wavelet generating circuit)
404, 1405 filter
502 received electric power detection part (including a dividing circuit and a wavelet position detection circuit)
705 integrator
902 S/P converting circuit
1402, 1502 intermittent oscillation circuit (wavelet generating circuit)
1403 wavelet waveform setting part
1404 waveform shaping circuit (second switch circuit)
1503 waveform setting amplifier

DETAILED DESCRIPTION OF THE PREFERRED EMBODIMENTS

Hereinafter, exemplary embodiments of the present invention are described with reference to drawings.

First Exemplary Embodiment

Figure 2A:
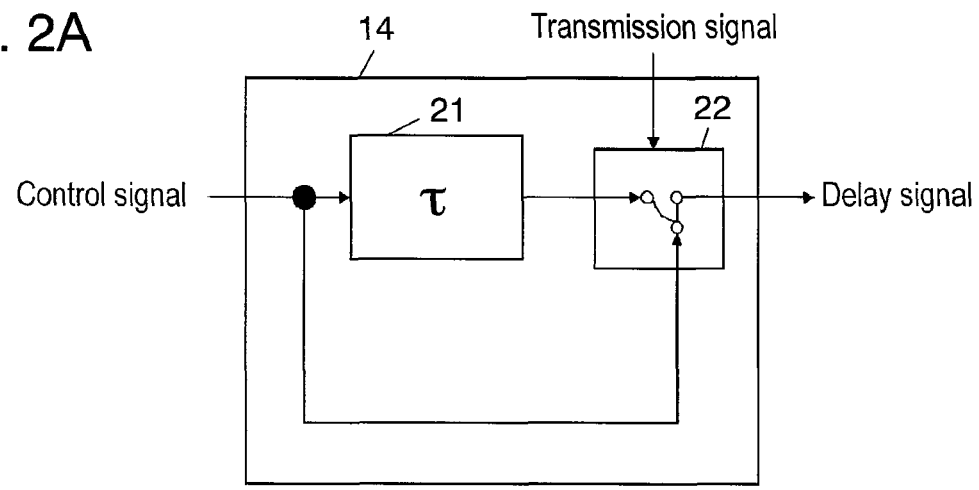
FIG. 2A is a block diagram showing a configuration of a delay part in accordance with this exemplary embodiment.
Figure 2B:
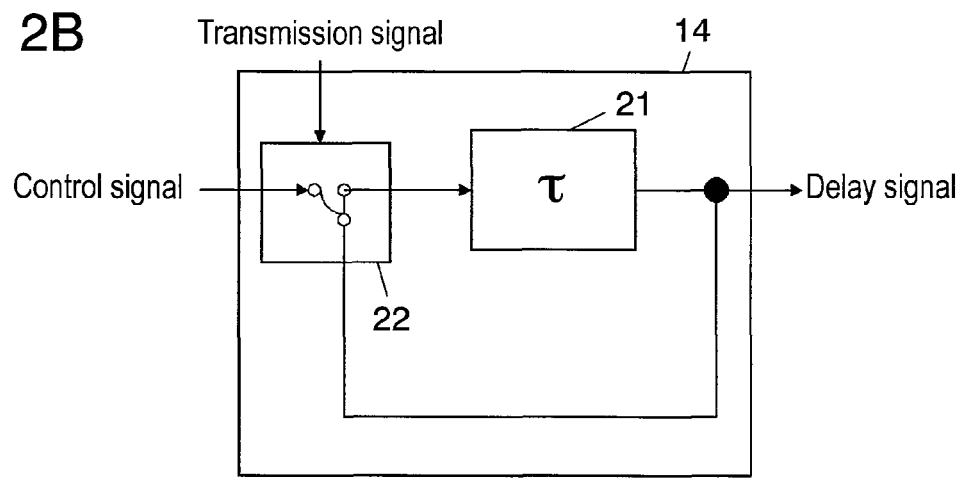
FIG. 2B is a block diagram showing a configuration of a delay part in accordance with this exemplary embodiment.
Figure 3:
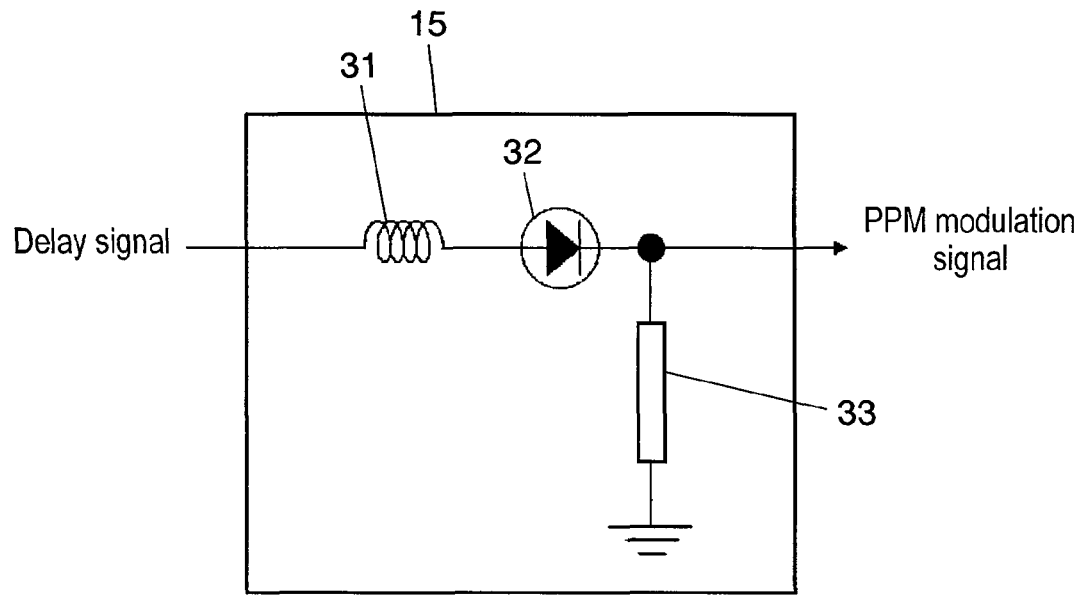
FIG. 3 is a block diagram showing a configuration of a wavelet generating part in accordance with this exemplary embodiment.
Figure 4:
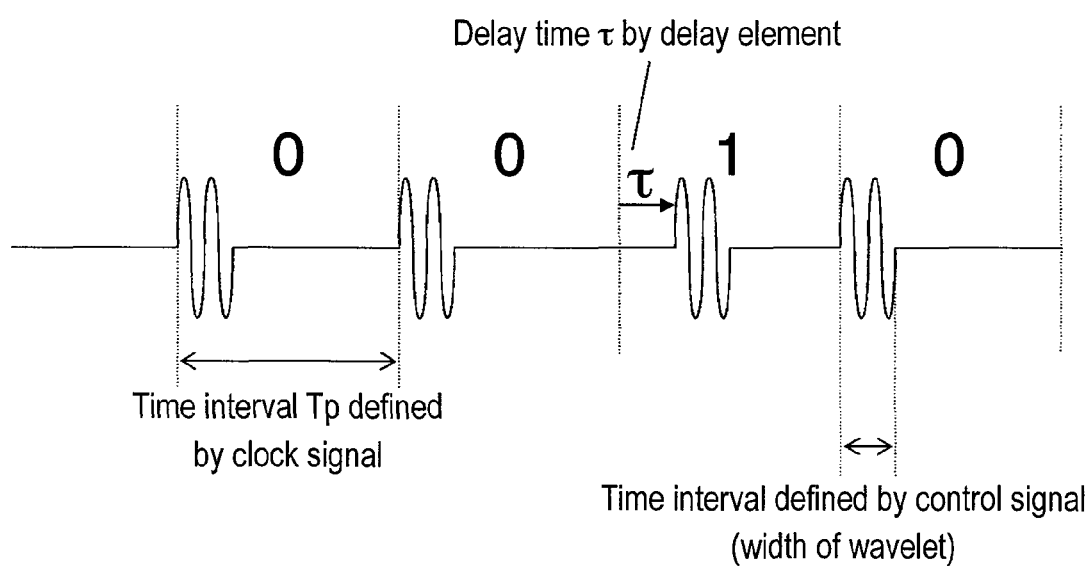
FIG. 4 shows a PPM modulation waveform of the modulating circuit in accordance with this exemplary embodiment.

FIG. 1 is a block diagram showing a configuration of a modulating circuit by PPM modulation in accordance with a first exemplary embodiment of the present invention. FIG. 2A is a block diagram showing a configuration of a delay part in accordance with this exemplary embodiment, and FIG. 2B is a block diagram showing a configuration of a delay part in accordance with this exemplary embodiment. FIG. 3 is a block diagram showing a configuration of a wavelet generating part in accordance with this exemplary embodiment. FIG. 4 shows a PPM modulation waveform of the modulating circuit in accordance with this exemplary embodiment.

In FIG. 1, clock generating part 11 generates a clock signal at a constant interval of signal transmission symbol rate. Transmission signal generating part 12 generates a transmission signal at the interval of the clock signal. For example, when the transmission signal is a binary digital signal, transmission signal generating part 12 generates two-state transmission signal in synchronization with the clock signal. Control signal generating part 13 supplies a control signal to wavelet generating part 15 based on the clock signal for a time suitable for the operation of wavelet generating part 15. Delay part 14 generates a delay signal obtained by changing the control signal by a delay amount of the clock signal based on the transmission signal. Wavelet generating part 15 obtains a PPM modulation signal by generating a wavelet at the generation timing of the delay signal.

Hereinafter, an operation of this exemplary embodiment in the configuration shown in FIG. 1 is described.

Clock generating part 11 supplies a clock signal defining the transmission symbol rate to transmission signal generating part 12 and control signal generating part 13. Transmission signal generating part 12 supplies a code to be transmitted as a transmission signal to delay part 14 in synchronization with the clock signal. At this time, when the code to be transmitted is a binary digital signal, the transmission signal is a two-state signal. Similarly, when the code is a multi-valued digital signal, the transmission signal is a multi-state signal.

Control signal generating part 13 generates a control signal for determining the width of a wavelet of the modulation signal in synchronization with the clock signal. For example, when the width of the wavelet of the modulation signal is in second, control signal generating part 13 generates a control signal having a duration of 1n second and supplies it to delay part 14. Delay part 14 supplies a delay signal obtained by delaying the control signal in response to the state of the transmission signal to wavelet generating part 15. For example, when the transmission signal is a two-state signal, delay part 14 changes the delay amount to 0 second or $\tau$ seconds. Herein, $\tau$ seconds mean a deviation value in the PPM modulation and generally is set to a time shorter than the interval of the clock signal. Delay part 14 can be realized with, for example, configurations shown in FIGS. 2A and 2B.

As shown in FIG. 2A, the control signal is divided into two parts. One control signal that has been delayed by time $\tau$ by delay element 21 and the other control signal that has not been delayed are supplied to switch 22. Switch 22 is configured so as to select one of the two input signals based on the transmission signal and to output the selected signal. Thus, the operation of delay part 14 can be realized. Note here that the operation of delay part 14 can also be realized with a configuration in which switch 22 is provided in front of delay element 21 as shown in FIG. 2B.

Wavelet generating part 15 in FIG. 1 generates a wavelet signal that has been delayed by a time of the delay signal based on the delay signal. For example, wavelet generating part 15 can be realized with a configuration shown in FIG. 3. In FIG. 3, wavelet generating part 15 includes inductor 31, tunnel diode 32 coupled to inductor 31 and resistance element 33 provided between an output terminal of tunnel diode 32 and a ground.

By the operation mentioned above, a PPM pulse modulation wave with $\tau$ seconds shown in FIG. 4 can be obtained. In FIG. 4, the clock signal is generated at time intervals "Tp".

As mentioned above, the configuration of this exemplary embodiment can realize a PPM modulating circuit by providing an additional circuit such as delay element 21 and switch 22 in addition to the components such as clock generating part 11 and transmission signal generating part 12, which have been necessary to an existing configuration. Thus, the amount of information to be transmitted can be increased with a simple configuration. A transmitting apparatus can be configured in a small size and at a low cost.

In this exemplary embodiment, an example in which PPM modulation is carried out by using a binary transmission signal is described. However, even when a ternary transmission signal or more multi-valued transmission signal is used, by increasing delay elements and switch elements in response to the signals, PPM modulation can similarly be carried out.

Second Exemplary Embodiment

Figure 5:
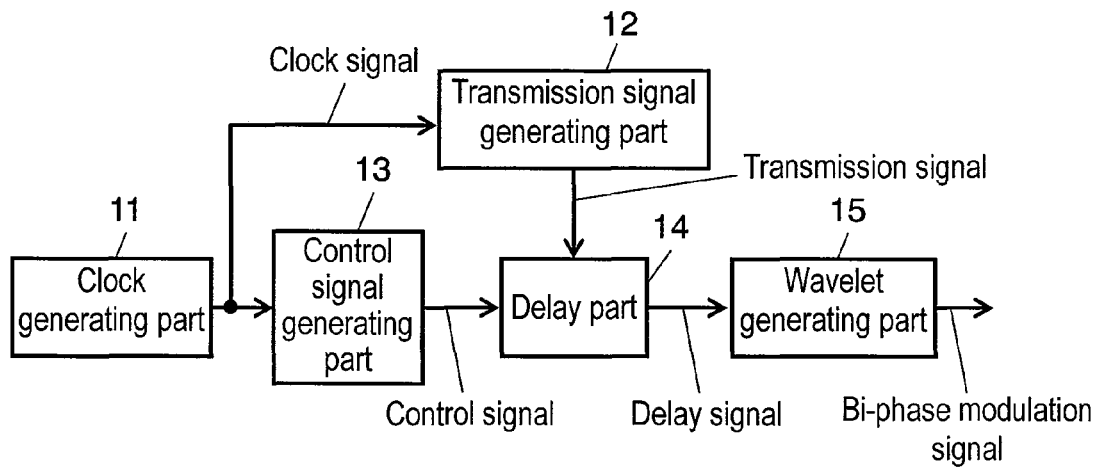
FIG. 5 is a block diagram showing a configuration of a modulating circuit by Bi-phase modulation in accordance with a second exemplary embodiment of the present invention.
Figure 6:
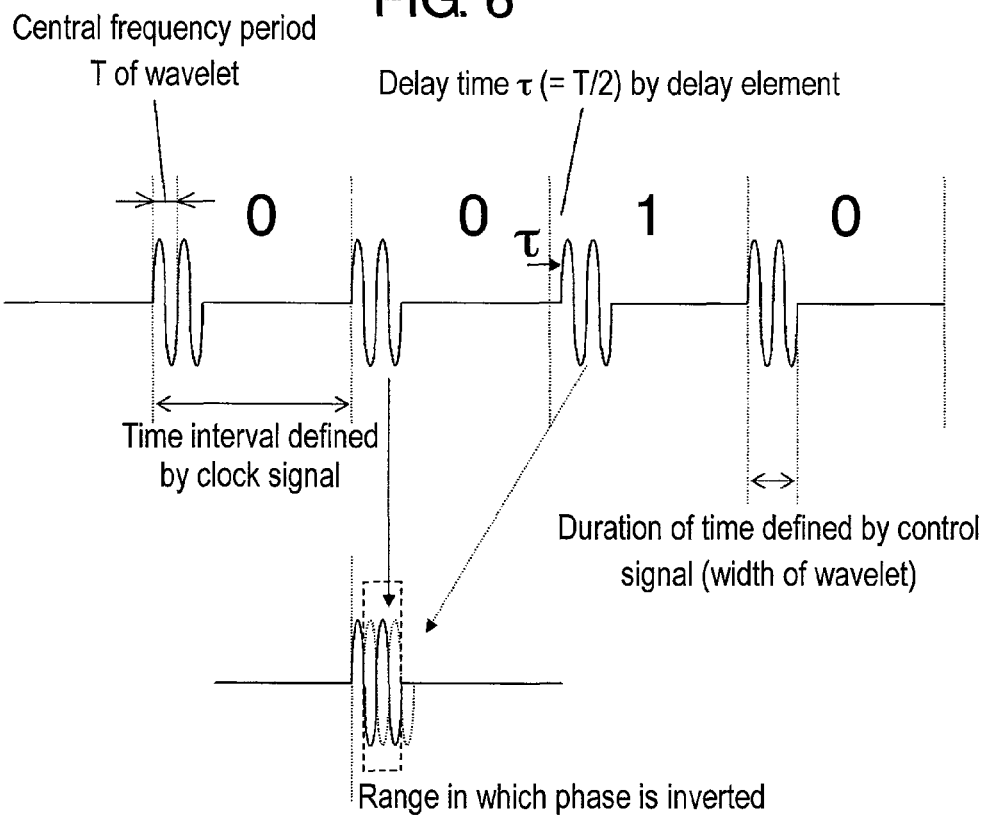
FIG. 6 shows a Bi-Phase modulation waveform of the modulating circuit in accordance with this exemplary embodiment.

FIG. 5 is a block diagram showing a Bi-phase modulating circuit in accordance with a second exemplary embodiment of the present invention. FIG. 6 shows a Bi-Phase modulation waveform of the modulating circuit in accordance with this exemplary embodiment. FIG. 5 is different from the above-mentioned first exemplary embodiment in that delay time $\tau$ in delay part 14 is defined as ½ of period T in the central frequency of a wavelet generated in wavelet generating part 15. Therefore, FIG. 1 and FIG. 5 are not different from each other in the block diagram. As mentioned below, by using this configuration, both PPM modulation and Bi-Phase modulation can be carried out simultaneously.

In FIG. 5, when delay time $\tau$ in delay part 14 is defined as ½ of period T in the central frequency of a wavelet generated in wavelet generating part 15, when the transmission signal is "0" and "1", a modulation signal similar to the Bi-Phase modulation shown in FIG. 6 is obtained. Since only the part surrounded by the broken line in FIG. 6 is a region in which the phase is inverted, exact Bi-Phase modulation signal cannot be obtained. However, waveforms other than the part surrounded by the broken line are less affected by the deformation as compared with the waveform in the received waveforms that have passed through an actual multipath. Therefore, by using a Bi-Phase demodulation method using a correlator and delay detection, demodulation can be carried out in principle.

Furthermore, as mentioned above, when a plurality of delay times $\tau$ of delay part 14 are prepared, a PPM modulation signal using both PPM modulation and Bi-Phase modulation can be obtained. Furthermore, in the above description, for simplification, delay time $\tau$ is defined as ½ of period T. However, when a plurality of delay parts, in which delay time $\tau$ is defined as 1/m of period T (m denotes an integer of 2 or more), are prepared, a PPM modulation signal using both PPM modulation and m-valued phase modulation can be obtained.

Third Exemplary Embodiment

Figure 7:
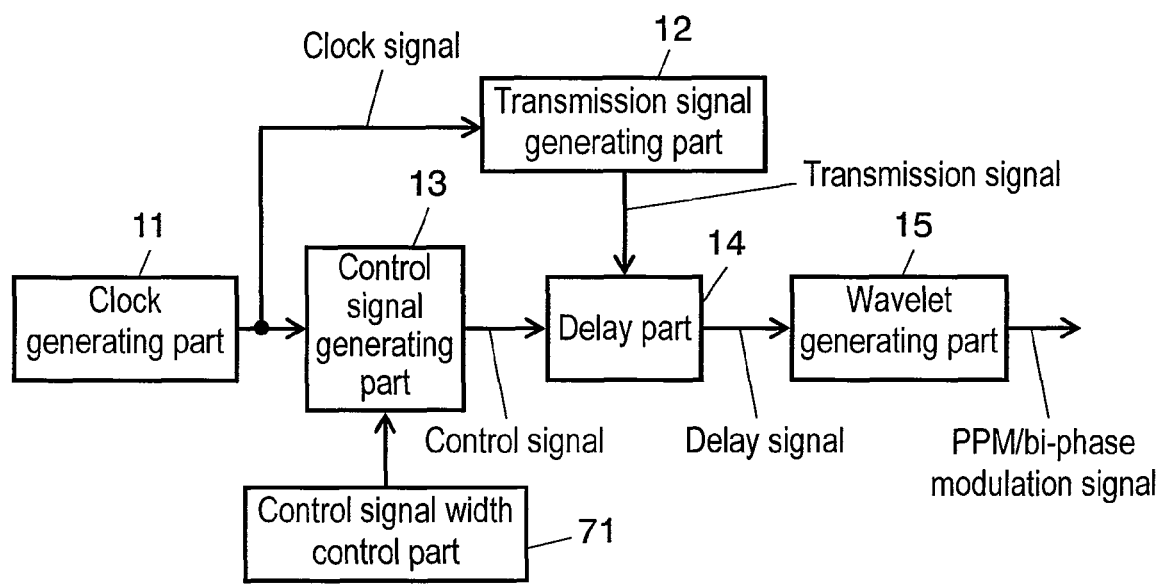
FIG. 7 is a block diagram showing a configuration of a modulating circuit by PPM/Bi-Phase modulation in accordance with a third exemplary embodiment of the present invention.

FIG. 7 is a block diagram showing a PPM modulating circuit or a Bi-Phase modulating circuit in accordance with a third exemplary embodiment of the present invention. FIG. 7 is different from the above-mentioned first exemplary embodiment in that control signal generating part 13 for determining the width of a wavelet generated in wavelet generating part 15 is provided with control signal width control part 71 for controlling the width of the control signal. Although long distance communication and reduction of power consumption are contradictory aims, these aims can be simultaneously accomplished by an adaptive control in this configuration.

That is to say, with this configuration, when long distance communication is required, by increasing the width of the wavelet so as to increase transmission electric power equivalently, the S/N ratio can be improved. Furthermore, when reduction of power consumption is required, shorter wavelet width is used so as to reduce the transmission electric power and thus the power consumption can be reduced.

Furthermore, when the synchronization at the initial stage of communication is established, it is necessary to improve the receiving sensitivity. Furthermore, when data transmission is carried out after synchronization is established, it is necessary to increase the communication capacity. These are also contradictory aims. However, according to this exemplary embodiment, with adaptive control, these aims can be accomplished simultaneously. That is to say, with this configuration, when the synchronization at the initial stage of communication is established, by increasing the width of the wavelet so as to increase transmission electric power equivalently, the S/N ratio can be improved. When data transmission is carried out after synchronization has been established, by using a shorter wavelet width so as to carry out communication using a wider band, the communication capacity can be increased.

In the above-mentioned wireless system, by using the wireless apparatuses of the above-mentioned first and second exemplary embodiments, a communication system can be realized with a simple configuration at a low cost.

Fourth Exemplary Embodiment

Figure 8A:
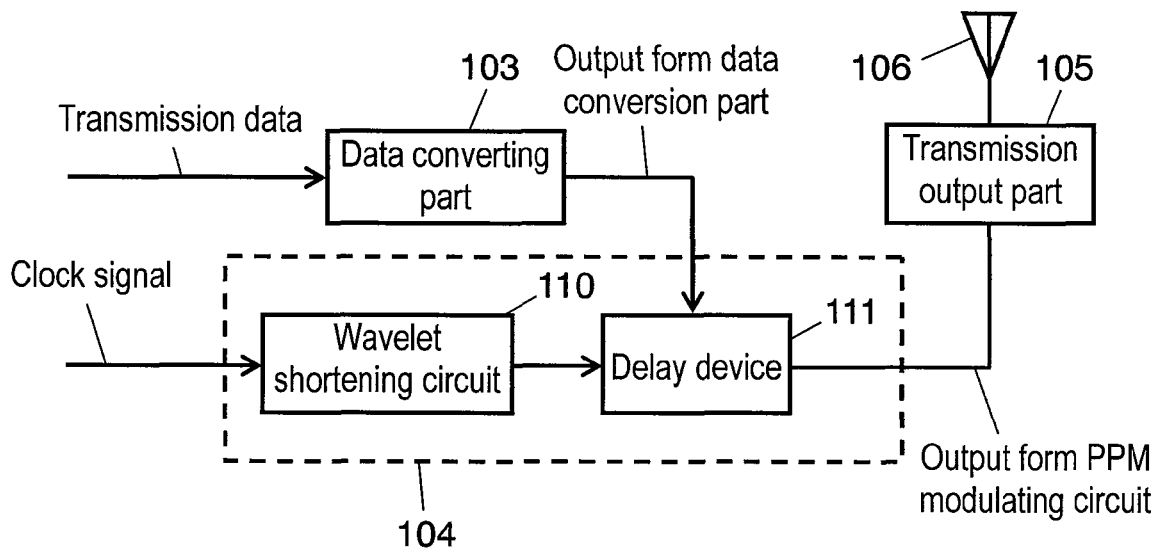
FIG. 8A is a block diagram showing a configuration of a transmitting apparatus in accordance with a fourth exemplary embodiment of the present invention.
Figure 8B:
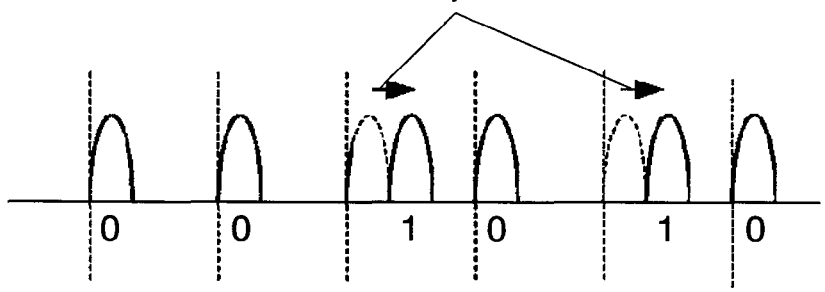
FIG. 8B shows a conventional wavelet position modulation waveform for comparison with a wavelet position modulation waveform of this exemplary embodiment.
Figure 8C:
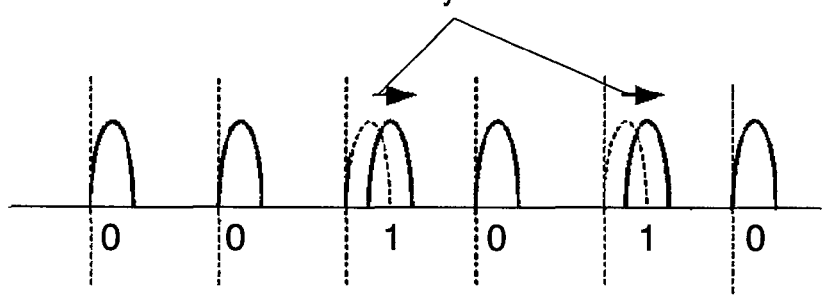
FIG. 8C shows the wavelet position modulation waveform of the transmitting apparatus in accordance with this exemplary embodiment.

FIG. 8A is a block diagram showing a configuration of a transmitting apparatus in accordance with a fourth exemplary embodiment of the present invention, FIG. 8B shows a conventional wavelet position modulation waveform for comparison with the wavelet position modulation waveform of the transmitting apparatus in accordance with this exemplary embodiment, and FIG. 8C shows a wavelet position modulation waveform of the transmitting apparatus in accordance with the exemplary embodiment.

In the block diagram shown in FIG. 8A, the transmitting apparatus of this exemplary embodiment includes data converting part 103 for converting input transmission data into data for wireless communication, PPM modulating circuit 104 for modulating the wavelet position by the output from data converting part 103, and transmission output part 105 for transmitting the output from PPM modulating circuit 104 from antenna 106. A receiving apparatus (not shown) for receiving a signal transmitted from the transmitting apparatus of this exemplary embodiment inputs the received signal into a correlation circuit (not shown) and allows the input received signal to be correlated with a correlation signal generated in a correlation signal generating circuit (not shown) so as to output a received correlation signal. The received correlation signal is input into a data converting part (not shown), and is output as received data after processing for wireless communication applied at the transmission side is removed.

PPM modulating circuit 104 includes wavelet shortening circuit 110 for generating a wavelet signal having a desired time width based on a rectangular clock signal and delay device 111 for delaying a signal from wavelet shortening circuit 110 in response to the output from data converting part 103 so as to carry out PPM modulation. Wavelet shortening circuit 110 may be configured by, for example, a logical product (AND) element of logic circuit IC and a delay circuit.

With reference to FIGS. 8B and 8C, the difference between a conventional PPM modulation and that of the present invention is described. In a conventional PPM modulation, as shown in FIG. 8B, the wavelets showing "0" and "1" are changed by a time hat is not shorter than the width of the wavelet, so that the receiving apparatus discriminates the difference of the positions. On the contrary, in the present invention, as shown in FIG. 8C, the wavelets showing "0" and "1" are changed by only a slight time that is not longer than the width of the wavelet, so that the receiving apparatus discriminates between "0" and "1" by carrying out correlation processing in the correlation circuit by the use of the correlation signal.

As mentioned above, in this exemplary embodiment, the transmitting apparatus modulates a wavelet with a slight time difference that is not longer than the width of the wavelet, and the receiving apparatus carries out correlation processing with a correlation signal so as to carry out pulse position modulation for detecting the wavelet position. Thereby, it is possible to realize a transmitting apparatus and a communication system capable of easily generating a desired waveform even for any very short wavelets and realizing a small size, low power consumption and a low cost.

Note here that a communication medium of the preset invention is not limited to wireless media, and wired media such as an optical fiber or a coaxial cable may be employed.

Fifth Exemplary Embodiment

Figure 9:
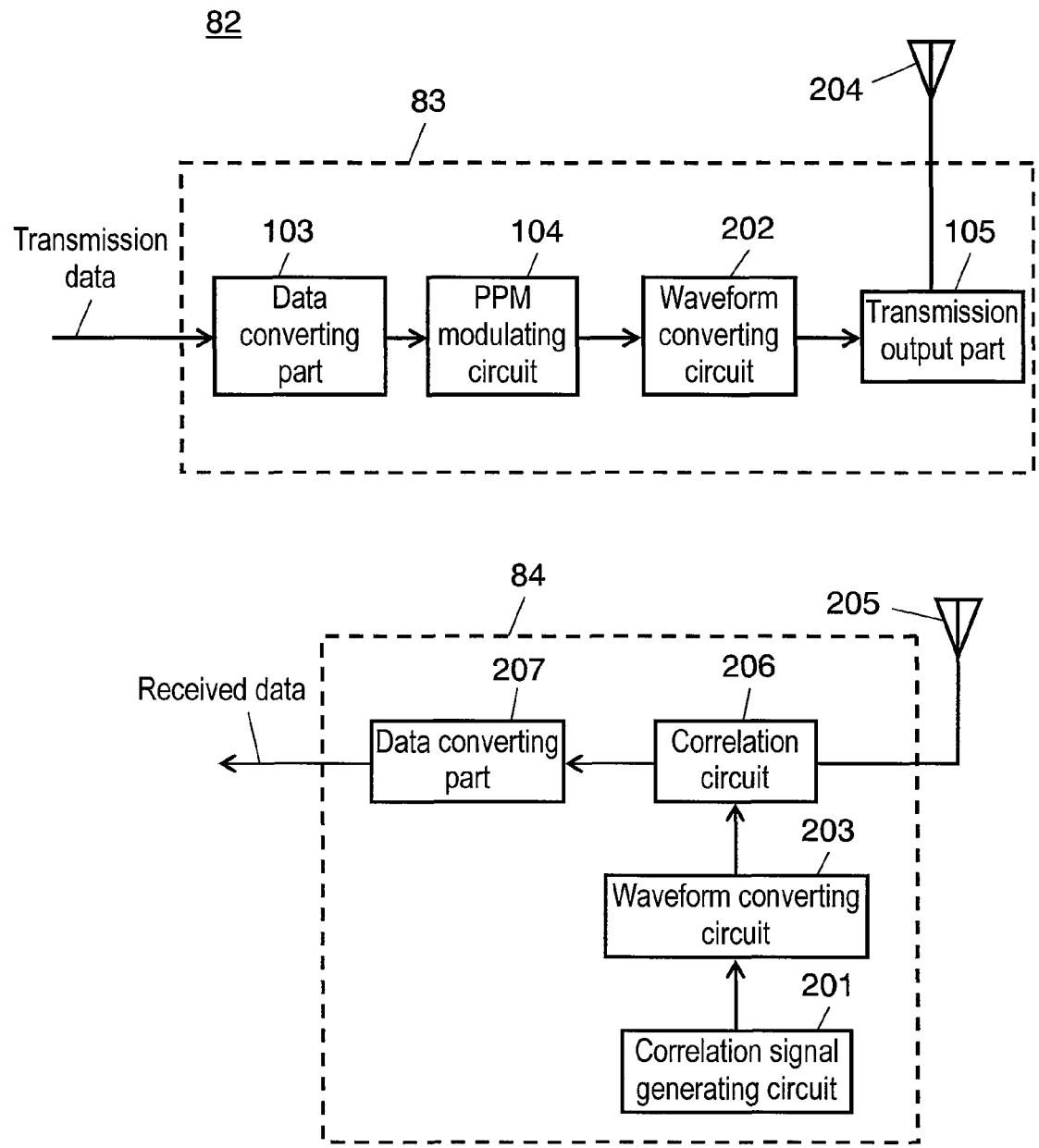
FIG. 9 is a block diagram showing a configuration of a communication system including a transmitting apparatus and a receiving apparatus in accordance with a fifth exemplary embodiment of the present invention.
Figure 10:
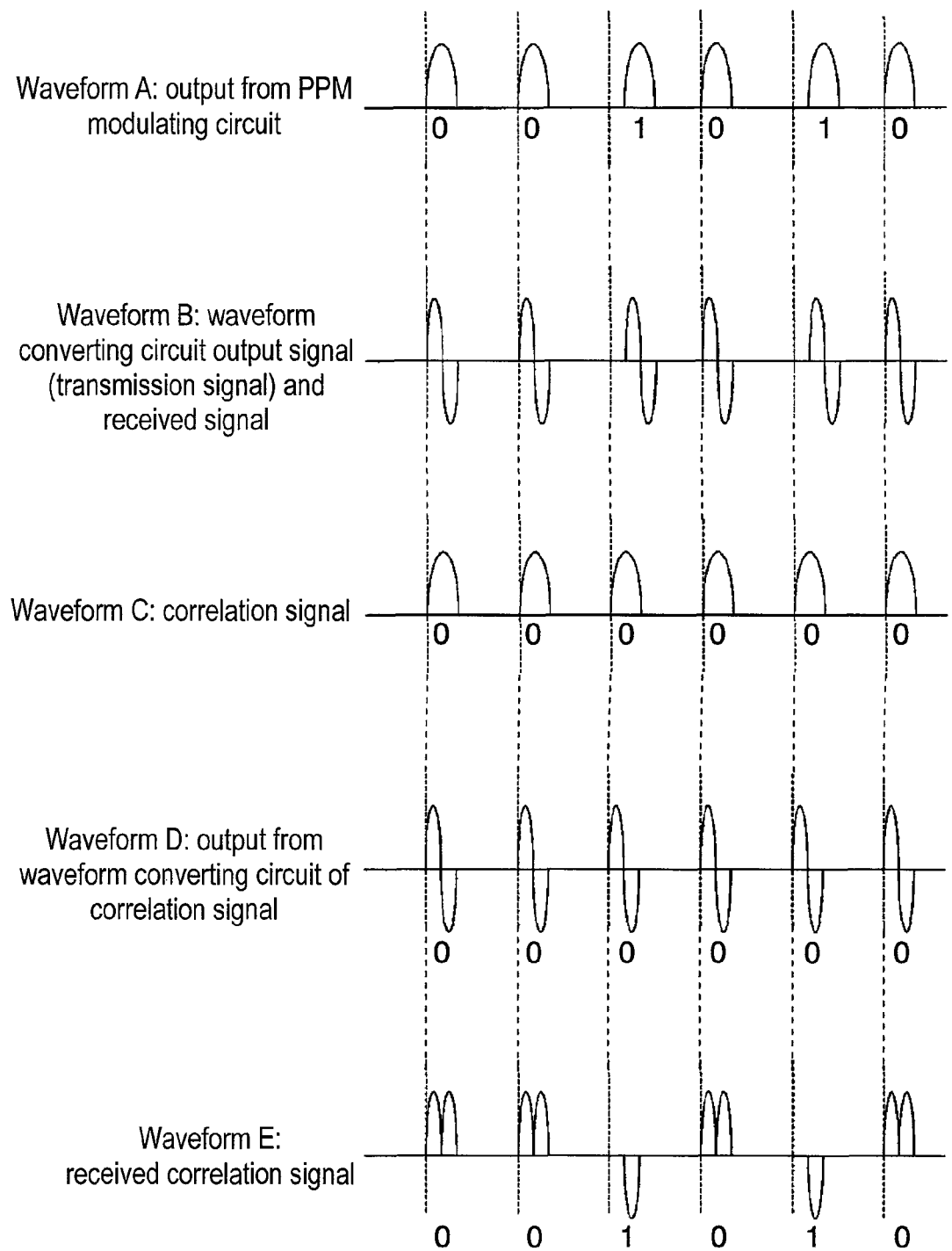
FIG. 10 shows waveforms in the transmitting apparatus and the receiving apparatus in accordance with this exemplary embodiment.
Figure 11A:
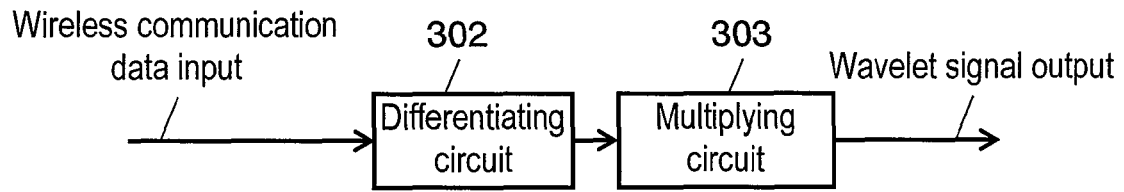
FIG. 11A is a block diagram showing a configuration of a waveform converting circuit of the transmitting apparatus and the receiving apparatus in accordance with this exemplary embodiment.
Figure 11B:
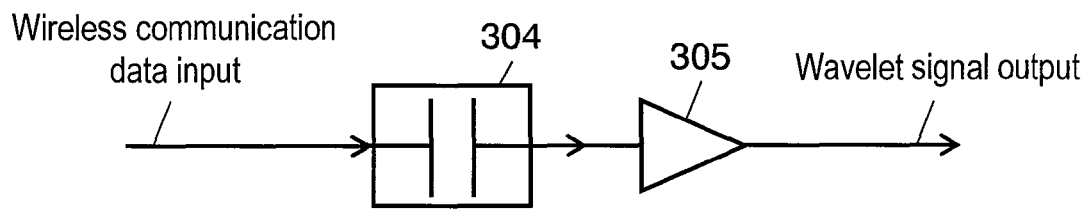
FIG. 11B is a circuit diagram showing the waveform converting circuit of the transmitting apparatus and the receiving apparatus in accordance with this exemplary embodiment.
Figure 12:
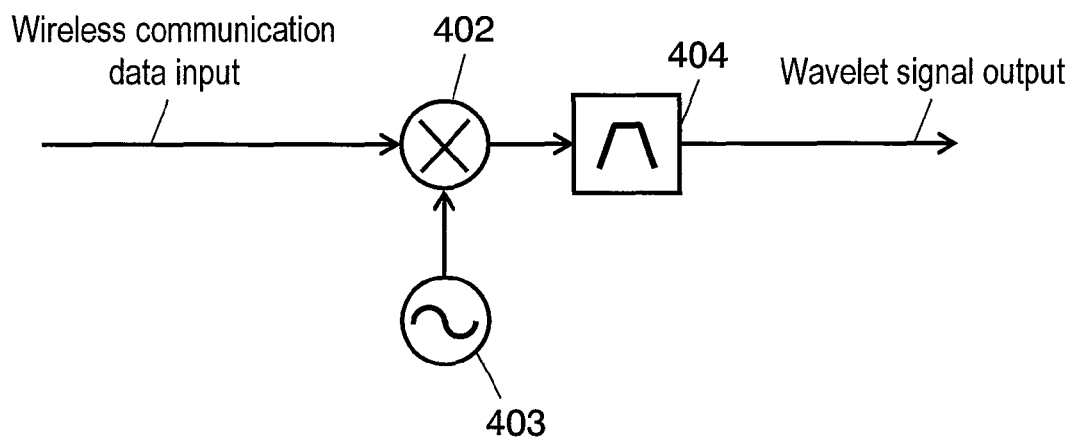
FIG. 12 is a block diagram showing another configuration of the waveform converting circuit of the transmitting apparatus and the receiving apparatus in accordance with this exemplary embodiment.
Figure 13:
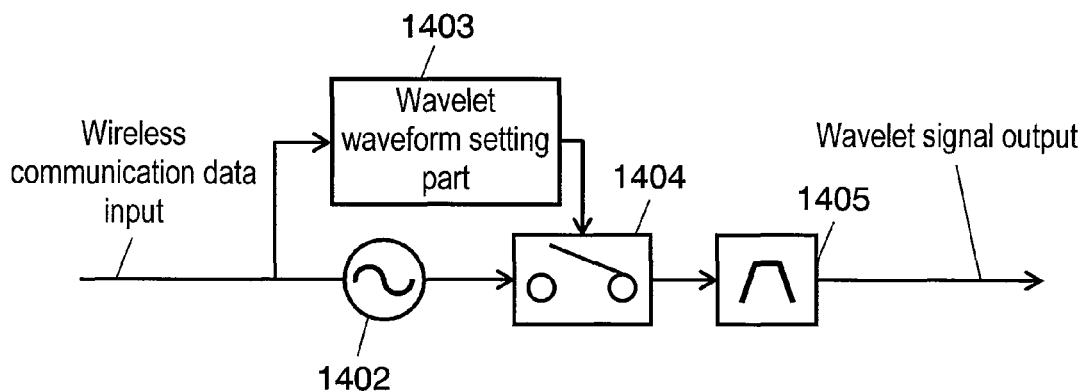
FIG. 13 is a block diagram showing another configuration of the waveform converting circuit of the transmitting apparatus and the receiving apparatus in accordance with this exemplary embodiment.

FIG. 9 is a block diagram showing a configuration of a transmitting apparatus, a receiving apparatus and a communication system in accordance with a fifth exemplary embodiment of the present invention. FIG. 10 shows waveforms in the transmitting apparatus, receiving apparatus and communication system in accordance with the fifth exemplary embodiment of the present invention. FIG. 11A is a block diagram showing a configuration of a waveform converting circuit of the transmitting apparatus and the receiving apparatus in accordance with this exemplary embodiment. FIG. 11B is a circuit diagram showing the waveform converting circuit of the transmitting apparatus and the receiving apparatus in accordance with this exemplary embodiment. FIG. 12 is a block diagram showing another configuration of the waveform converting circuit of the transmitting apparatus and the receiving apparatus in accordance with this exemplary embodiment. FIG. 13 is a block diagram showing another configuration of the waveform converting circuit of the transmitting apparatus and the receiving apparatus in accordance with this exemplary embodiment.

Figure 14:
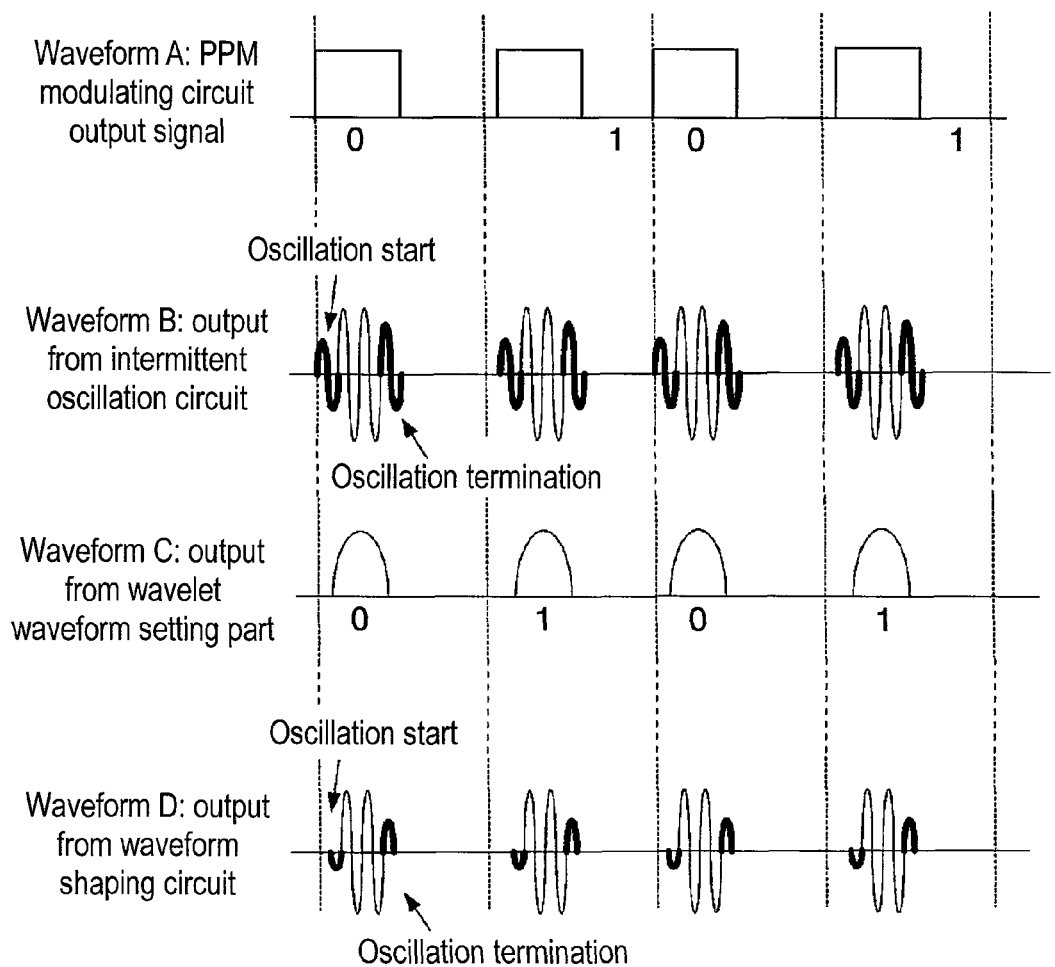
FIG. 14 shows waveforms in the waveform converting circuit of the transmitting apparatus and the receiving apparatus in accordance with this exemplary embodiment.
Figure 15:
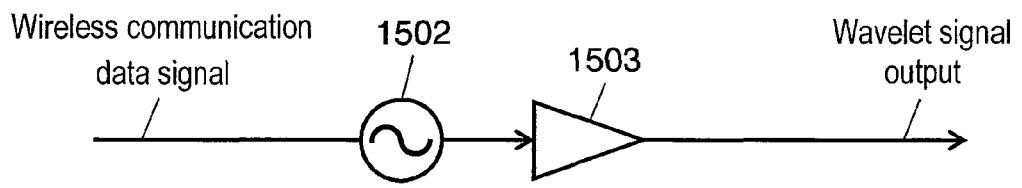
FIG. 15 is a block diagram showing a configuration of the waveform converting circuit of the transmitting apparatus and the receiving apparatus in accordance with this exemplary embodiment.
Figure 16A:
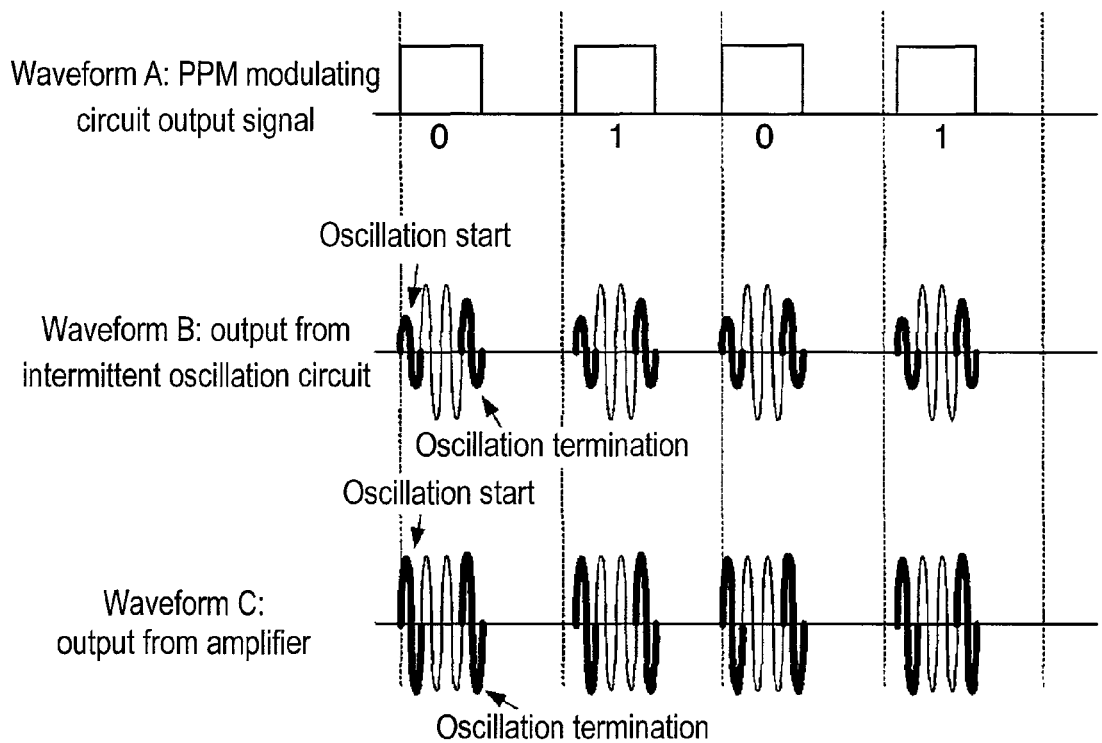
FIG. 16A shows waveforms of the waveform converting circuit of the transmitting apparatus and the receiving apparatus in accordance with this exemplary embodiment.
Figure 16B:
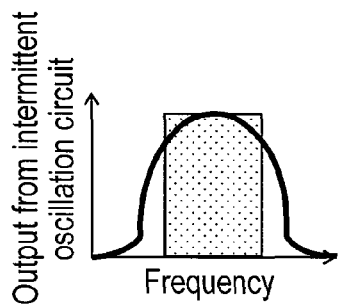
FIG. 16B shows frequency characteristic of the output of intermittent oscillation circuit of a waveform converting circuit in this exemplary embodiment.
Figure 16C:
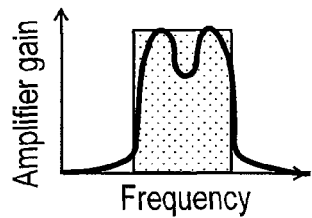
FIG. 16C shows frequency characteristic of amplifier gain of the waveform converting circuit in this exemplary embodiment.
Figure 16D:
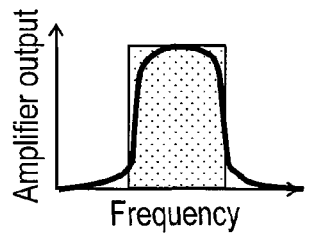
FIG. 16D shows frequency characteristic of the output of an amplifier of the waveform converting circuit in this exemplary embodiment.

FIG. 14 shows waveforms in the waveform converting circuit of the transmitting apparatus and the receiving apparatus in accordance with this exemplary embodiment. FIG. 15 is a block diagram showing a configuration of a waveform converting circuit of the transmitting apparatus and the receiving apparatus in accordance with this exemplary embodiment. FIG. 16A shows waveforms of the waveform converting circuit of the transmitting apparatus and the receiving apparatus in accordance with this exemplary embodiment, FIG. 16B shows frequency characteristic of the output of an intermittent oscillation circuit of the waveform converting circuit in this exemplary embodiment, FIG. 16C shows frequency characteristic of amplifier gain of the waveform converting circuit in this exemplary embodiment, and FIG. 16D shows frequency characteristic of the amplifier output of the waveform converting circuit in this exemplary embodiment.

Transmitting apparatus 83 constituting communication system 82 in this exemplary embodiment is different from that of the first exemplary embodiment in the following point. Transmitting apparatus 83 includes waveform converting circuit 202. An output from PPM modulating circuit 104 is converted into a wavelet in waveform converting circuit 202 so that pulse position modulation is carried out with a slight time difference in response to the wavelet, and transmitted from transmission output part 105 via antenna 204.

In FIG. 9, receiving apparatus 84 constituting communication system 82 of this exemplary embodiment includes antenna 205 for receiving a signal, correlation signal generating circuit 201 for generating a correlation signal, waveform converting circuit 203 for converting the correlation signal generated in correlation signal generating circuit 201 into a wavelet, correlation circuit 206 for correlating the received signal received by antenna 205 with the converted correlation signal output from waveform converting circuit 203 so as to output a received correlation signal, and data converting part 207 for carrying out data conversion of the received correlation signal output by correlation circuit 206.

An example of the waveform conversion in waveform converting circuit 202 includes conversion from the output signal from PPM modulating circuit 104 shown in waveform A in FIG. 10 into one cycle of sine wave that is a wavelet shown in waveform B in FIG. 10. In this exemplary embodiment, the sine wave to which data "0" is assigned has a delay time of 0 with respect to the reference; and the sine wave to which data "1" is assigned has a delay time of T/2 with respect to the reference. Note here that T denotes a time of one period of the sine wave shown in waveform B in FIG. 10. The output of waveform converting circuit 202 is transmitted from transmission output part 105 via antenna 204 as a transmission signal. Next, an operation when receiving apparatus 84 receives signals is described.

The signal received by antenna 205 is input into correlation circuit 206. For simplifying the description, the received signal at this time is assumed to have a waveform shown in waveform B in FIG. 10, which is the same as that of the transmission signal. Needless to say, actually, because of attenuation by propagation, noise and multipath may be added. As the correlation signal generated in correlation signal generating circuit 201, for example, a signal shown in waveform C in FIG. 10 is used. The correlation signal generated at appropriate timing is input into waveform converting circuit 203 and a signal shown in waveform D in FIG. 10 is generated. The correlation signal is waveform-converted in waveform converting circuit 203. Thereby, the correlation signal is converted into a wavelet similar to that of the received signal, and input into correlation circuit 206 as a converted correlation signal so that high correlation with respect to the received signal can be obtained.

Thus, the received correlation signal shown in waveform E in FIG. 10 is obtained. When the wavelet "0" is input, the correlation waveform shows a plus voltage signal, and when the wavelet "1" is input, the correlation waveform shows a minus voltage signal. Data converting part 207 carries out determination whether "0" or "1" based on whether the received correlation signal is plus or minus with the respect to the reference voltage of, for example, 0 V, demodulates the received signal, and outputs the demodulated signal as received data. Characteristically, using a signal at the position "0" as the correlation signal as shown in waveform C in FIG. 10 makes it possible to demodulate the received signal. Therefore, for example, it is not necessary that the transmitting side and the receiving side share data row of "0" and "1" and match them to each other.

In order to stabilize the voltage at the time of determination, the output signal of correlation circuit 206 may be stabilized by using a filter or a peak hold circuit. Furthermore, in the above description, an example of continuously using "0" as the correlation signal is described. However, "1" may be continuously used.

Furthermore, based on the output signal level of correlation circuit 206, an error rate after demodulation, and the like, the correlation signal generated in correlation signal generating circuit 201 may be switched between "0" and "1". Furthermore, in the above description, the configuration in which waveform converting circuit 202 is used so as to convert the waveform of the output signal of PPM modulating circuit 104 is shown. However, the same advantage can be obtained by a configuration in which the output signal of waveform converting circuit 202 is modulated at the position of the wavelet by using PPM modulating circuit 104.

Next, an example of realizing a waveform converting circuit in this exemplary embodiment is described with reference to FIGS. 11A to 11B and FIG. 12.

In FIGS. 11A to 11B, the waveform converting circuit includes differentiating circuit 302 and multiplying circuit 303. Input wireless communication data are differentiated by differentiating circuit 302 once so as to be converted into a signal similar to, for example, a sine wave, and then, multiplied in multiplying circuit 303 so as to generate desired cycles of wavelets. As shown in FIG. 11B, as differentiating circuit 302, for example, capacitor 304 can be used; and as multiplying circuit 303, transistor multiplier 305 using transistor can be used.

As differentiating circuit 302, a logic circuit IC (not shown) may be used. As multiplying circuit 303, a multiplying circuit using a diode (not shown) may be used.

FIG. 12 shows an example of realizing the waveform converting circuit, which is different from that shown in FIGS. 11A to 11B. The waveform converting circuit shown in FIG. 12 is configured by using signal source 403 and mixer 402. At this time, the waveform converting circuit may be configured so that unnecessary frequency components are removed by filter 404. Furthermore, in the above description, an example in which the waveform converting circuit converts a waveform into one period of sine wave is described. However, it may convert the waveform into two periods or more of sine waves.

Furthermore, in the above description, an example, in which the waveform converting circuit converts a waveform into a sine wave or a waveform similar to a sine wave, is shown. Waveforms having a constant pulse-repetition period such as a triangular wave, sawtooth wave, trapezoid wave, continuous Gaussian pulses, differentiated wave of the Gaussian pulse may be used.

Furthermore, the waveform converting circuit of this exemplary embodiment may be configured as shown in FIGS. 13 and 15 so as to shape a waveform. In FIG. 13, the waveform converting circuit includes intermittent oscillation circuit 1402 for starting and terminating the oscillation by using the input wireless communication data as a control signal, wavelet waveform setting part 1403 for determining the generation timing of wavelet and the waveform based on the input wireless communication data, and waveform shaping circuit 1404 for shaping a waveform of the output signal of intermittent oscillation circuit 1402 based on the output from wavelet waveform setting part 1403. Filter 1405 for removing unnecessary components may be added.

A signal in each part of the waveform converting circuit is described with reference to FIG. 14. For example, a signal output from the PPM modulating circuit shown in waveform A in FIG. 14 is input into intermittent oscillation circuit 1402 as an input pulse signal. As the output signal, a signal shown in waveform B in FIG. 14 can be obtained. As shown in thick lines of waveform B in FIG. 14, the output signal of intermittent oscillation circuit 1402 is continued to be output for a predetermined time although its input and output shows that the amplitude is small at the oscillation starting time and a control signal is changed at the oscillation terminating time due to the time constant value of the circuit.

Since the properties at the starting time and terminating time of the oscillation are changed due to the intervals of neighboring pulses, it is difficult to uniquely control the properties. Thus, a spectrum is changed depending upon the input wireless communication data, which causes a problem from the viewpoint of transmission electric power control and band control. In order to prevent such a problem, a signal shown in waveform C in FIG. 14 is output from wavelet waveform setting part 1403. Based on this signal, waveform shaping circuit 1404 determines the waveform at the start and termination of the wavelet. Thus, a signal that has been controlled to have a certain wavelet width and a desired waveform as shown in waveform D in FIG. 14 can be shaped as a transmission output.

As waveform shaping circuit 1404, a switch circuit having a short time constant may be used. Furthermore, filter 1405 may be added to the output of waveform shaping circuit 1404 or used together so that waveform shaping circuit 1404 has a waveform shaping function.

Next, with reference to FIG. 15, FIGS. 16A to 16D, an example of realizing a different waveform converting circuit is described. In FIG. 15, the waveform converting circuit includes intermittent oscillation circuit 1502 for starting and terminating oscillation by using input wireless communication data as a control signal, and waveform setting amplifier 1503 for amplifying the output from intermittent oscillation circuit 1502 by arbitrary frequency characteristics.

With reference to FIGS. 16A to 16D, a signal in each part in FIG. 15 is described. Similar to FIG. 14, as shown in, for example, thick lines in waveform B in FIG. 16A, the output signal of intermittent oscillation circuit 1502 is continued to be output for a predetermined time although its output and input show that the amplitude is small at the oscillation starting time and a control signal is changed at the oscillation terminating time due to the time constant value of the circuit. As shown in FIG. 16B, the frequency characteristic of this signal shows low electric power at both ends of the frequency band to be used of the input wireless communication data. In order to compensate this, as shown in FIG. 16C, by providing waveform setting amplifier 1503 with frequency characteristic showing high gain at both ends of the frequency band to be used, the output of waveform setting amplifier 1503 can be a spectrum showing a constant electric power to both ends of the frequency band to be used as shown in FIG. 16D. The wavelet output waveform from the waveform converting circuit can be a wavelet signal having an amplitude that is constant from the starting time to the termination time of oscillation as shown in waveform C in FIG. 16A. It is possible to carry out the communication with wavelets having a uniform transmission electric power spectrum with respect to a frequency band to be used.

As mentioned above, in accordance with the transmitting apparatus, receiving apparatus and communication system in the fifth exemplary embodiment of the present invention, a pulse is converted into a wavelet and pulse position modulation for modulating with a slight time difference in response to the wavelet is carried out. Thereby, in the transmitting apparatus, a desired waveform can be easily generated even for any very short wavelets, and small size, low power consumption and low cost can be realized. In the receiving apparatus, wavelets can be easily separated and the communication speed can be improved easily.

Sixth Exemplary Embodiment

Figure 17:
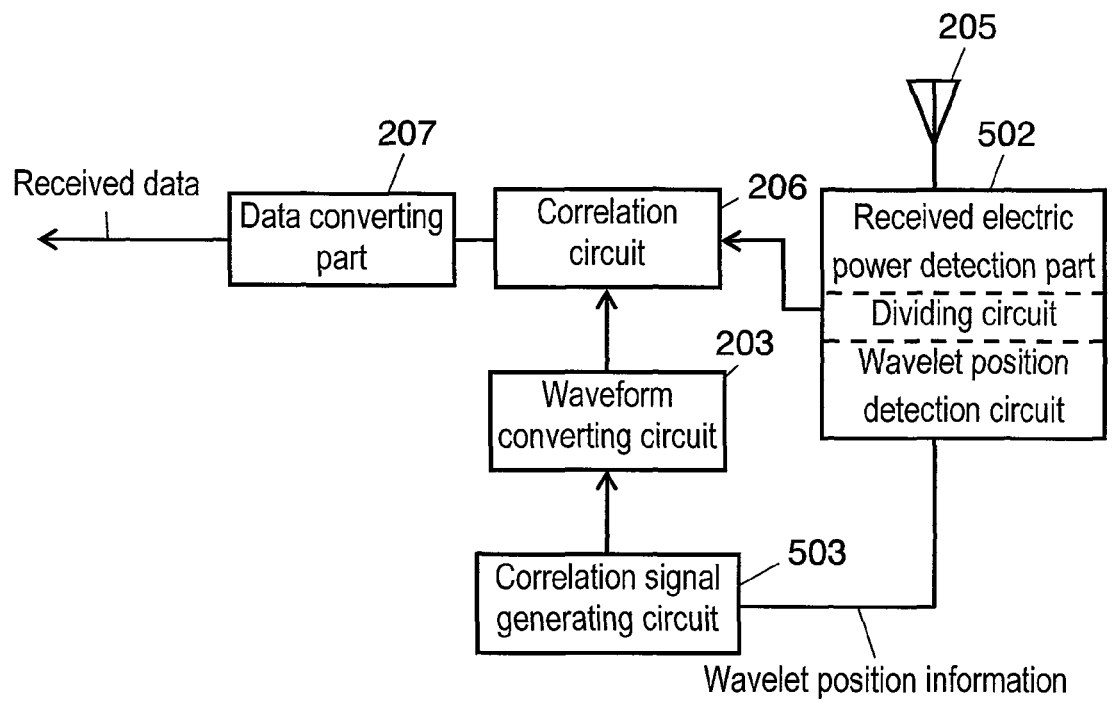
FIG. 17 is a block diagram showing a configuration of a receiving apparatus in accordance with a sixth exemplary embodiment of the present invention.
Figure 18:
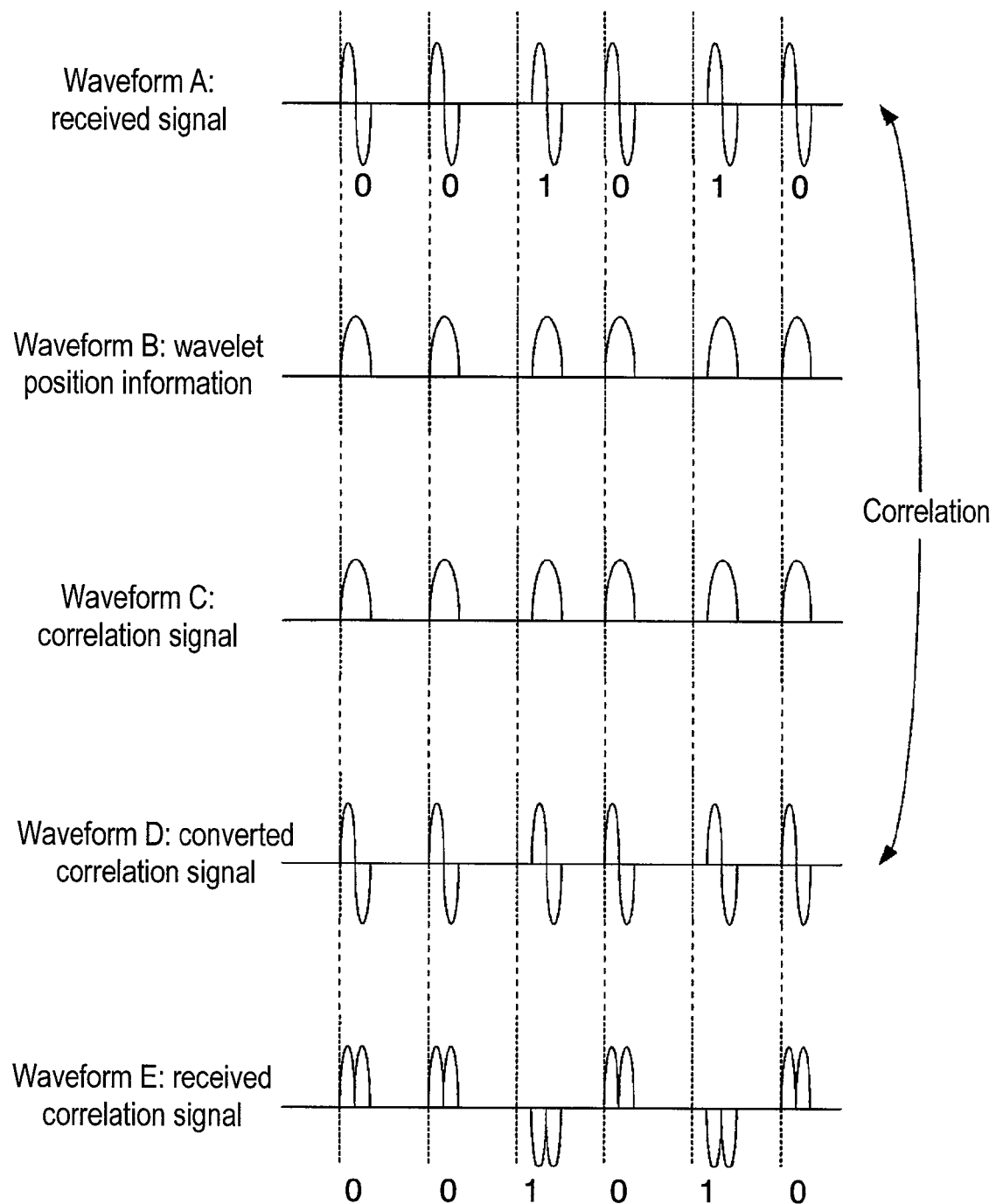
FIG. 18 shows waveforms in the receiving apparatus in accordance with this exemplary embodiment.
Figure 19:
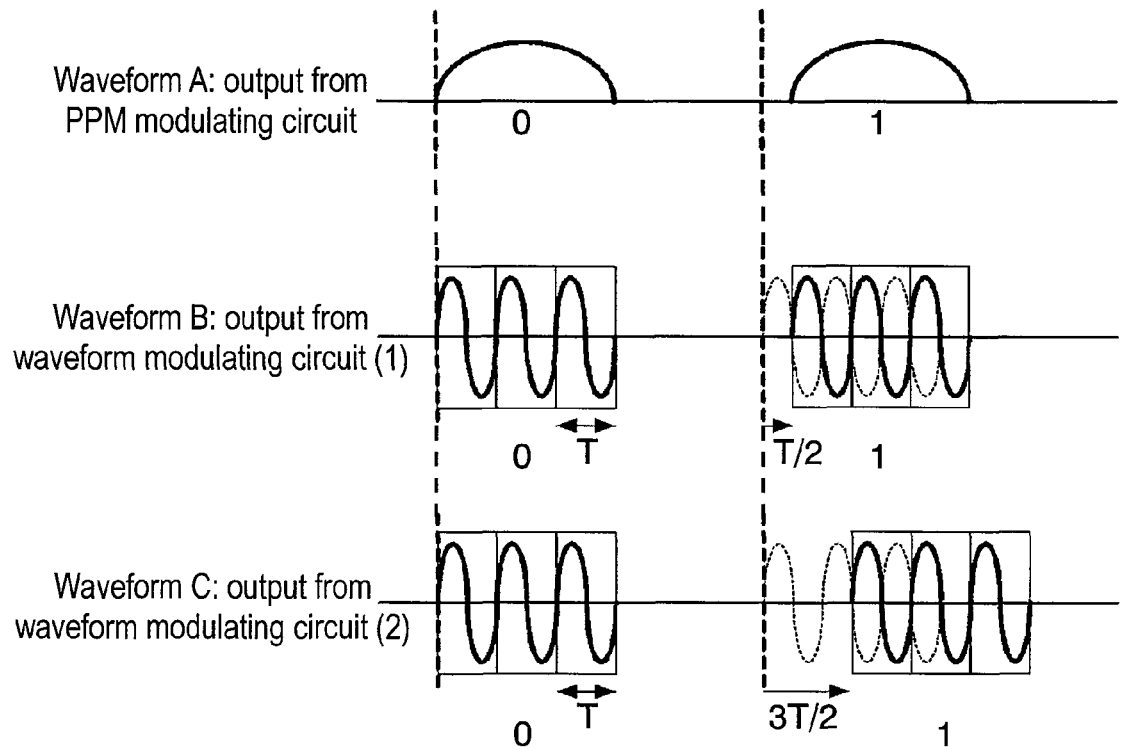
FIG. 19 shows a waveform in a transmitting apparatus corresponding to the receiving apparatus in accordance with this exemplary embodiment.

FIG. 17 is a block diagram showing a configuration of a receiving apparatus in accordance with a sixth exemplary embodiment of the present invention. FIG. 18 shows waveforms in the receiving apparatus in accordance with the sixth exemplary embodiment. FIG. 19 shows waveforms in a transmitting apparatus corresponding to the receiving apparatus in accordance with this exemplary embodiment. The receiving apparatus of this exemplary embodiment is different from that of the fifth exemplary embodiment in that the receiving apparatus of this exemplary embodiment includes received electric power detection part 502, which includes a dividing circuit and a wavelet position detection circuit. Received electric power detection part 502 detects a wavelet position of the received signal, outputs a wavelet position information signal, and inputs the signal to correlation signal generating circuit 503, thereby determining the timing of correlation signal generation or assisting the determination.

Although the details are not described in the fifth exemplary embodiment, in FIG. 17, in correlation circuit 206, in order to correlate a received signal that has passed through received electric power detection part 502 with a correlation signal that has been output from correlation signal generating circuit 503 and converted in waveform converting circuit 203, the timings of the signals are necessary to be matched (synchronized) with each other. In general, for adjusting the timings, a delay lock loop (DLL) and the like is used. Also in this case, when the initial value of the delay amount is close to the final delay amount, the adjusting time is shorter and the synchronization can be carried out for a short time. With reference to FIGS. 17 and 18, an operation of the receiving apparatus of this exemplary embodiment is described. The waveforms shown in FIG. 18 are just examples and the present invention is not limited to these waveforms alone.

A received signal received by antenna 205 is firstly input into received electric power detection part 502. The waveform at this time is a sine wave shown in, for example, waveform A in FIG. 18 and it is PPM modulated at the transmission side. Information "0" and "1" are assigned to the positions. Received electric power detection part 502 divides the received signal into two portions. One of them is output to correlation circuit 206 and the other is output to correlation signal generating circuit 503 as wavelet position information showing the position of the wavelet. A signal showing wavelet position information may be a signal obtained by rectifying the received signal shown in waveform A in FIG. 18 in received electric power detection part 502 and extracting only the absolute value of the amplitude of the signal as shown in waveform B in FIG. 18.

The absolute value of a signal can be extracted by, for example, a detector using a diode. Correlation signal generating circuit 503 outputs a correlation signal shown in waveform C in FIG. 18 in response to the wavelet position information from received electric power detection part 502.

There is no clear difference between waveform B in FIG. 18 and waveform C in FIG. 18. This is because a signal in a realistic state, which does not include noise or multipath signal, is used as a received signal. In actual communication conditions, depending upon the setting of a determination value of detection signal in received electric power detection part 502, detection error due to noise or multipath occurs (a signal is output in a position in which no signal exists or no signal is output in a position in which signal exists).

Correlation signal generating circuit 503 selects only possible timing from the wavelet position information and outputs the correlation signal by using the selected timing as the timing for the correlation signal. An example of means for selecting the possible timing includes a means of ignoring signals other than intervals in which "0" or "1" exists as a noise, and means for selecting a signal having a larger amplitude value as a possible signal when signals exist in both output timings of "0" and "1."

The correlation signal output from correlation signal generating circuit 503 is input into waveform converting circuit 203 and converted into a converted correlation signal shown in waveform D in FIG. 18. Correlation circuit 206 correlates a received signal from received electric power detection part 502 with a converted correlation signal so as to output a received correlation signal shown in waveform E in FIG. 18. By determining whether plus or minus of the amplitude of this signal, whether "1" or "0" is determined so as to obtain received data.

The timing of a signal input from received electric power detection part 502 to correlator 505 may be appropriately delayed so that the timing matches the timing of the input from waveform converting circuit 203 by providing received electric power detection part 502 with an appropriate delay circuit.

As mentioned above, according to the receiving apparatus of the third exemplary embodiment, by providing the received electric power detection part, wavelet position information is obtained from the electric power of the received signal, and based on this information, a correlation signal is generated so as to be correlated with the received signal. Thus, the wavelets can be separated easily and the communication speed can be improved easily.

In the transmitting apparatus corresponding to the receiving apparatus in accordance with this exemplary embodiment, as shown in waveform B in FIG. 19, each wavelet position change in the PPM modulating circuit output signal shown in waveform A in FIG. 19 is shown as an example of receiving a signal transmitted at half of period T (period T/2) in the central frequency of the wavelet. However, as shown in waveform C in FIG. 19, the period may be 3T/2. Thus, the period may be nT/2 (n is an odd integer) with respect to signal period T.

Seventh Exemplary Embodiment

Figure 20:
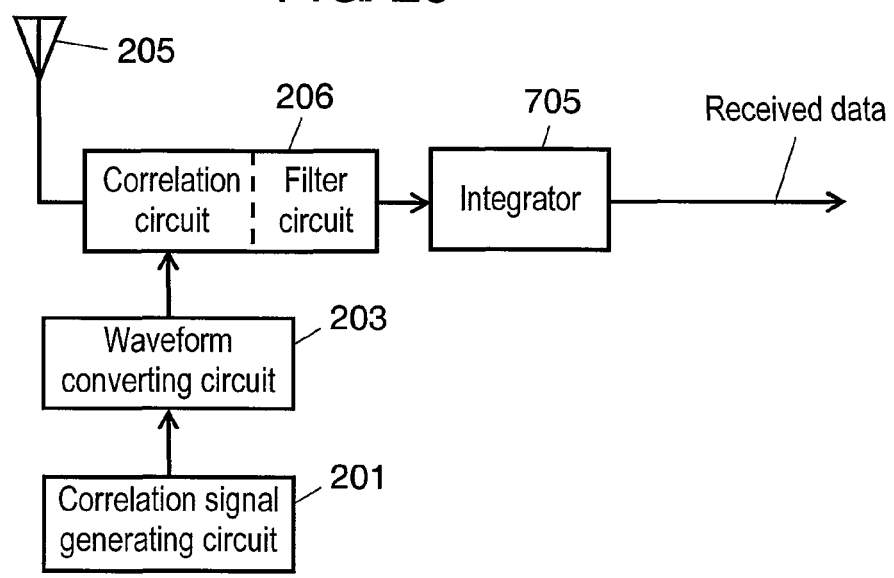
FIG. 20 is a block diagram showing a configuration of a receiving apparatus in accordance with a seventh exemplary embodiment of the present invention.
Figure 21:
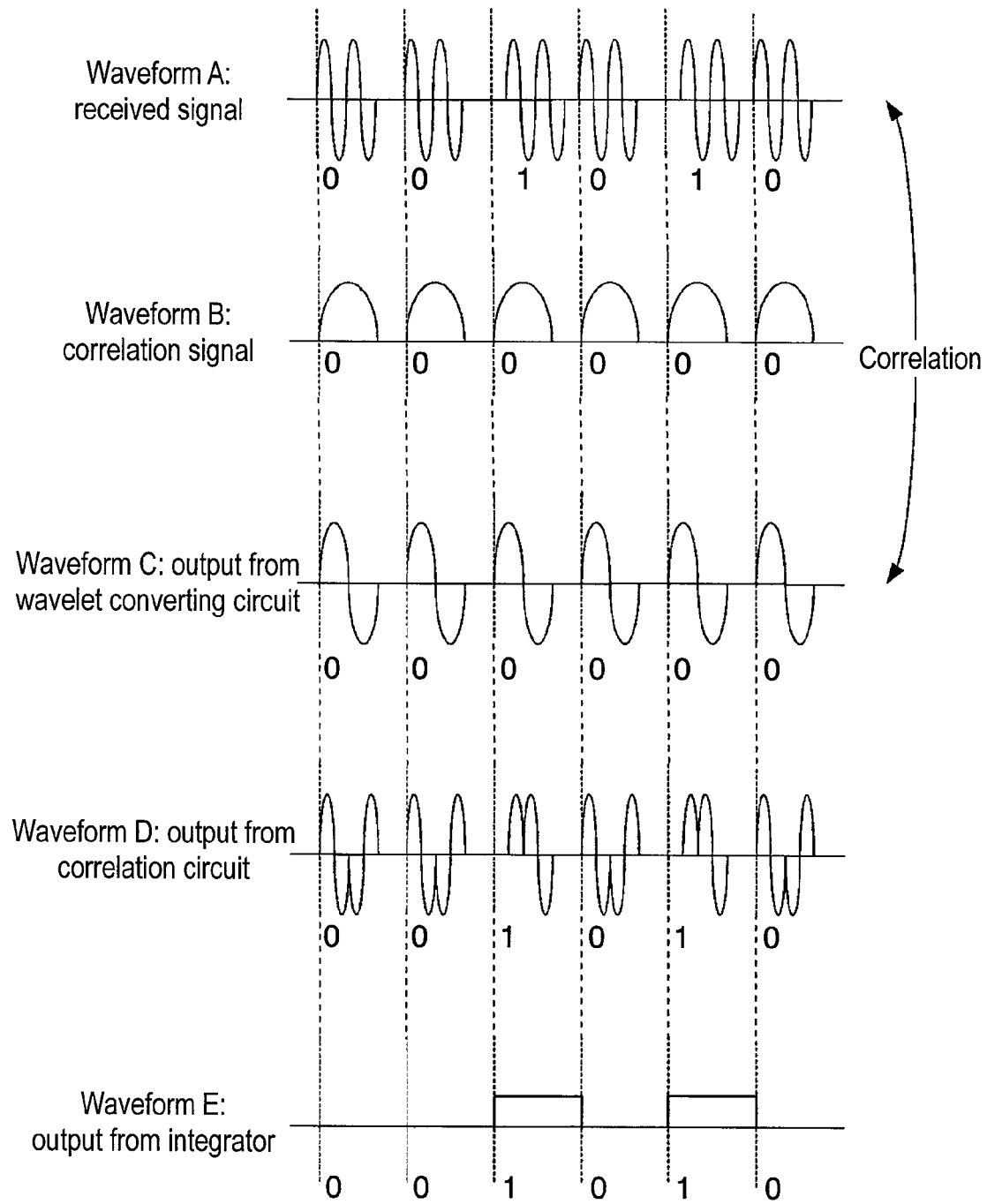
FIG. 21 shows waveforms in the receiving apparatus in accordance with this exemplary embodiment.
Figure 22:
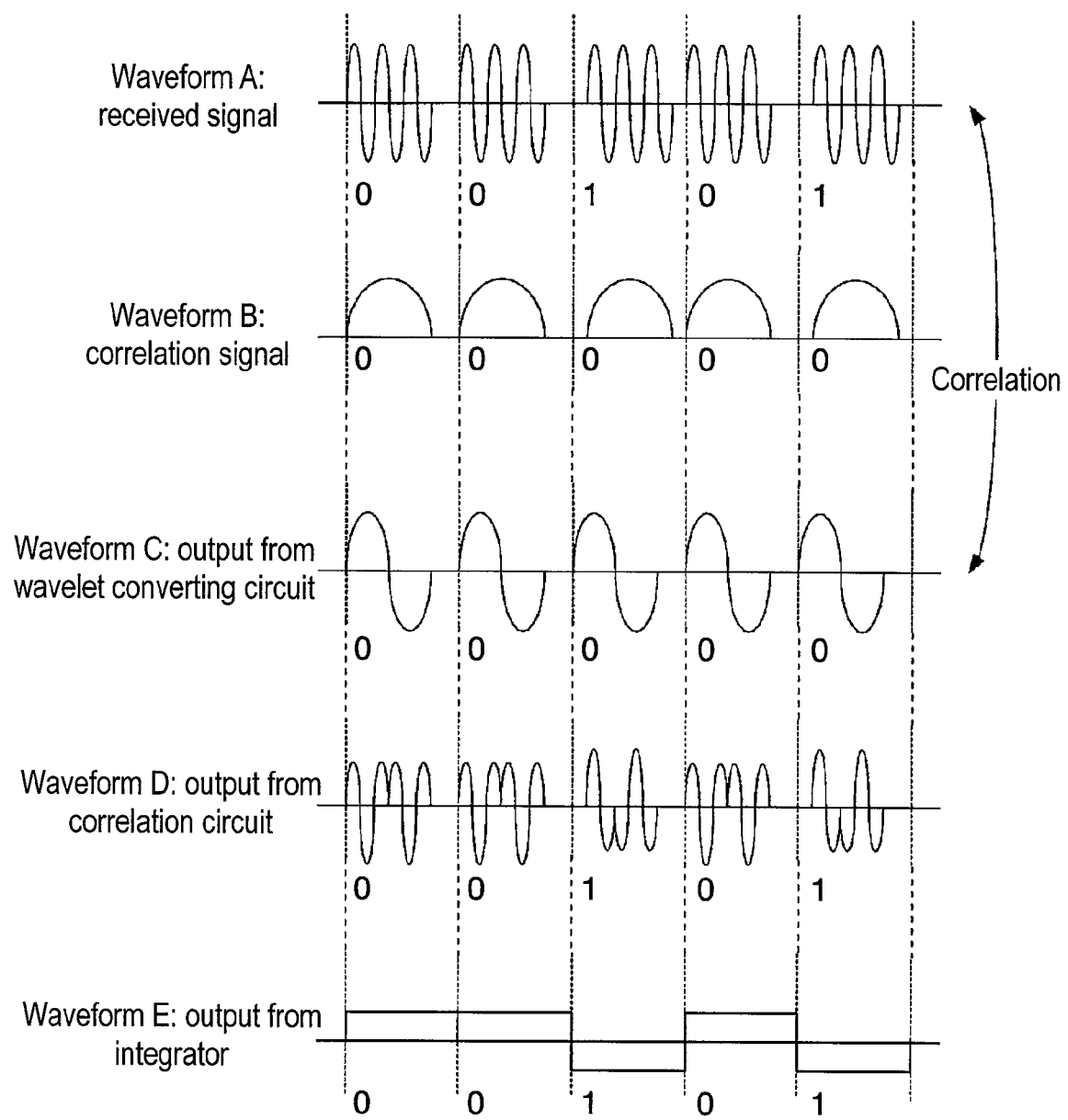
FIG. 22 shows waveforms in the receiving apparatus in accordance with this exemplary embodiment.

FIG. 20 is a block diagram showing a configuration of a receiving apparatus in accordance with a seventh exemplary embodiment of the present invention. FIG. 21 shows waveforms in the receiving apparatus in accordance with this exemplary embodiment. FIG. 22 shows other waveforms in the receiving apparatus in accordance with this exemplary embodiment. This exemplary embodiment is different from the fifth exemplary embodiment in that a converted correlation signal input from waveform converting circuit 203 to correlation circuit 206 uses a signal having a frequency that is lower than the frequency of the received signal input from antenna 205.

The operation of the receiving apparatus of this exemplary embodiment is described with reference to FIG. 20. A correlation signal output from correlation signal generating circuit 201 is waveform-converted in waveform converting circuit 203 and passes through a filter circuit after it is correlated with the received signal from antenna 205 in correlation circuit 206. Then, in integrator 705, higher harmonic components are removed, and the signal is output as received data. An output waveform in each part of the receiving apparatus in this exemplary embodiment is described with reference to FIG. 21. The received signal input from antenna 205 is a PPM modulation signal that has been converted into a wavelet in the transmitting apparatus. For simplifying the description, a signal in which noise or multipath is ignored as shown in waveform A in FIG. 21 is used.

The correlation signal output from correlation signal generating circuit 201 is generated, for example, at the timing of 0 of the PPM modulation signal as shown in waveform B in FIG. 21. As mentioned above, the correlation signal is waveform-converted in waveform converting circuit 203. However, unlike the fifth to sixth exemplary embodiments, in this exemplary embodiment, as shown in waveform C in FIG. 21, it is converted into a signal with a frequency that is ½ with respect to that of the received signal. The output signal of correlation circuit 206 has a waveform as shown in waveform D in FIG. 21. By integrating this signal by integrator 705, as shown in waveform E in FIG. 21, a signal having different voltage values between "0" and "1" is output. By discriminating between "0" and "1" by using an appropriate voltage value as reference, data can be extracted.

Furthermore, FIG. 22 shows an example in which a converted correlation signal is a signal having ⅓ frequency with respect to that of the received signal. An output waveform in each part of FIG. 20 is described with reference to FIG. 22. The converted correlation signal is converted from the correlation signal into a signal having ⅓ frequency with respect to the received signal in waveform converting circuit 203 as shown in waveform C in FIG. 22. The received correlation signal output from correlation circuit 206 is a signal shown in waveform D of FIG. 22. By integrating this signal by integrator 705, a signal having voltage values that are different between "0" and "1" is output as shown in waveform E in FIG. 22. As compared with the case where the signal period of the converted correlation signal is made to be ½, when the signal period is made to be ⅓ period of the received signal, it is possible to uniquely discriminate between "0" and "1" with reference to 0V. Thus, it becomes easy to determine the reference voltage.

In the example described above, when waveform conversion is carried out in waveform converting circuit 203, the frequency is made to be ⅓ of the received signal. However, when the frequency is 1/odd number, by integrator 705, the reference voltage can be uniquely 0V at the time of determining whether the output signal is "0" or "1".

As mentioned above, according to the receiving apparatus in the seventh exemplary embodiment of the present invention, when correlation processing with a converted correlation signal having a lower frequency than that of the received signal period, wavelets can be separated easily and the communication speed can be easily improved.

Eighth Exemplary Embodiment

Figure 23:
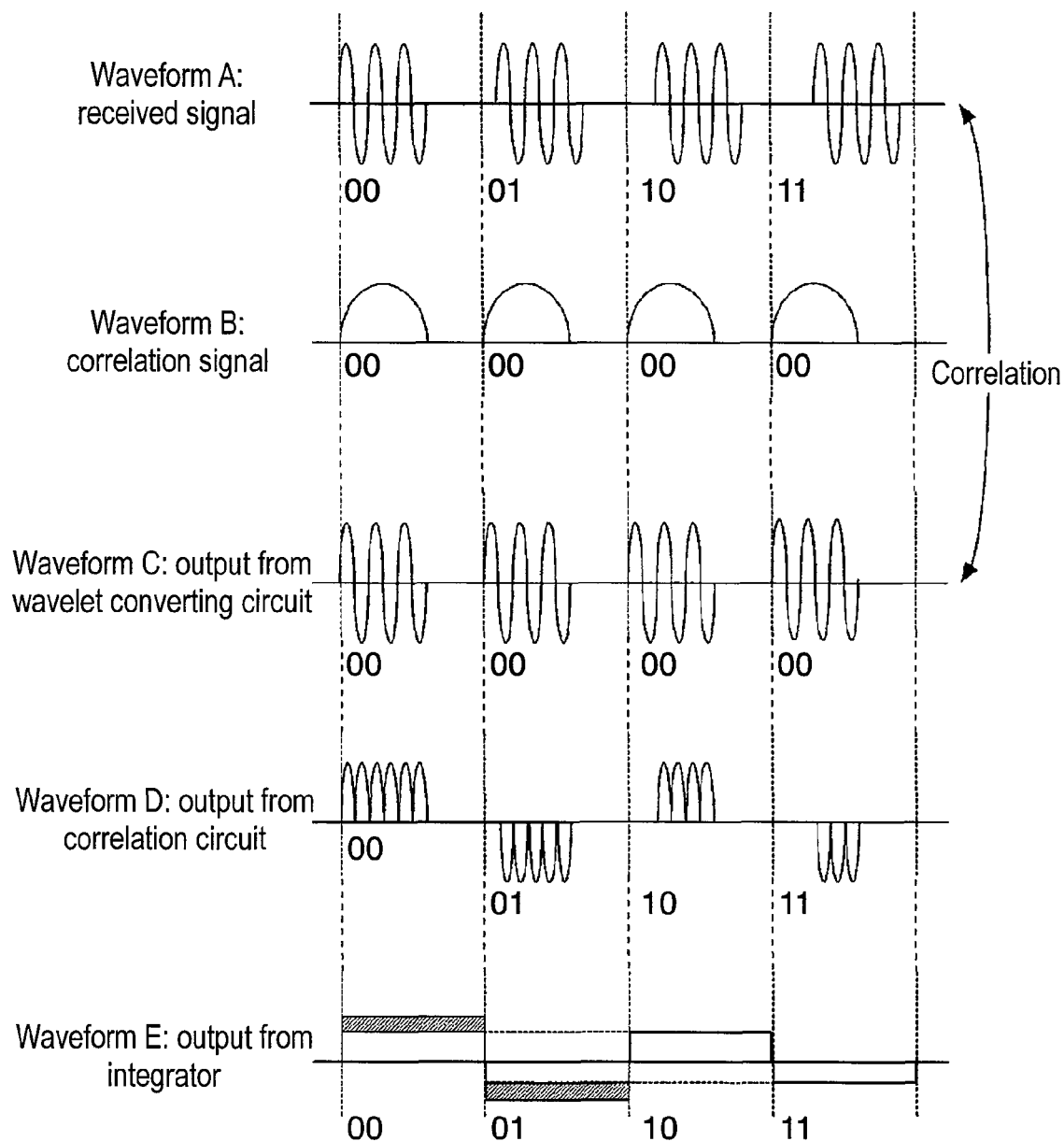
FIG. 23 shows waveforms in a receiving apparatus in accordance with an eighth exemplary embodiment.
Figure 24:
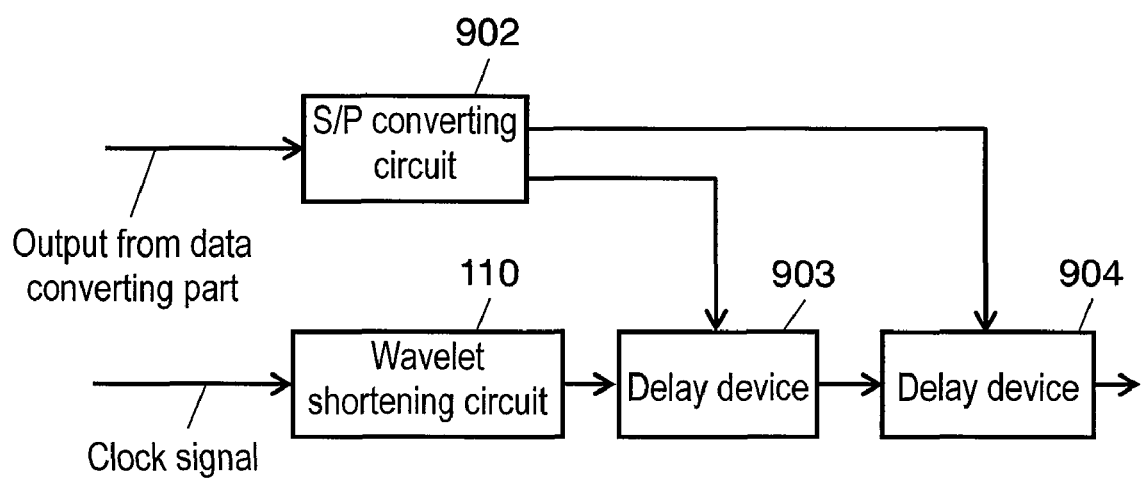
FIG. 24 is a block diagram showing a configuration of a PPM modulating circuit of a transmitting apparatus for transmitting signals to the receiving apparatus in accordance with this exemplary embodiment.
Figure 25:
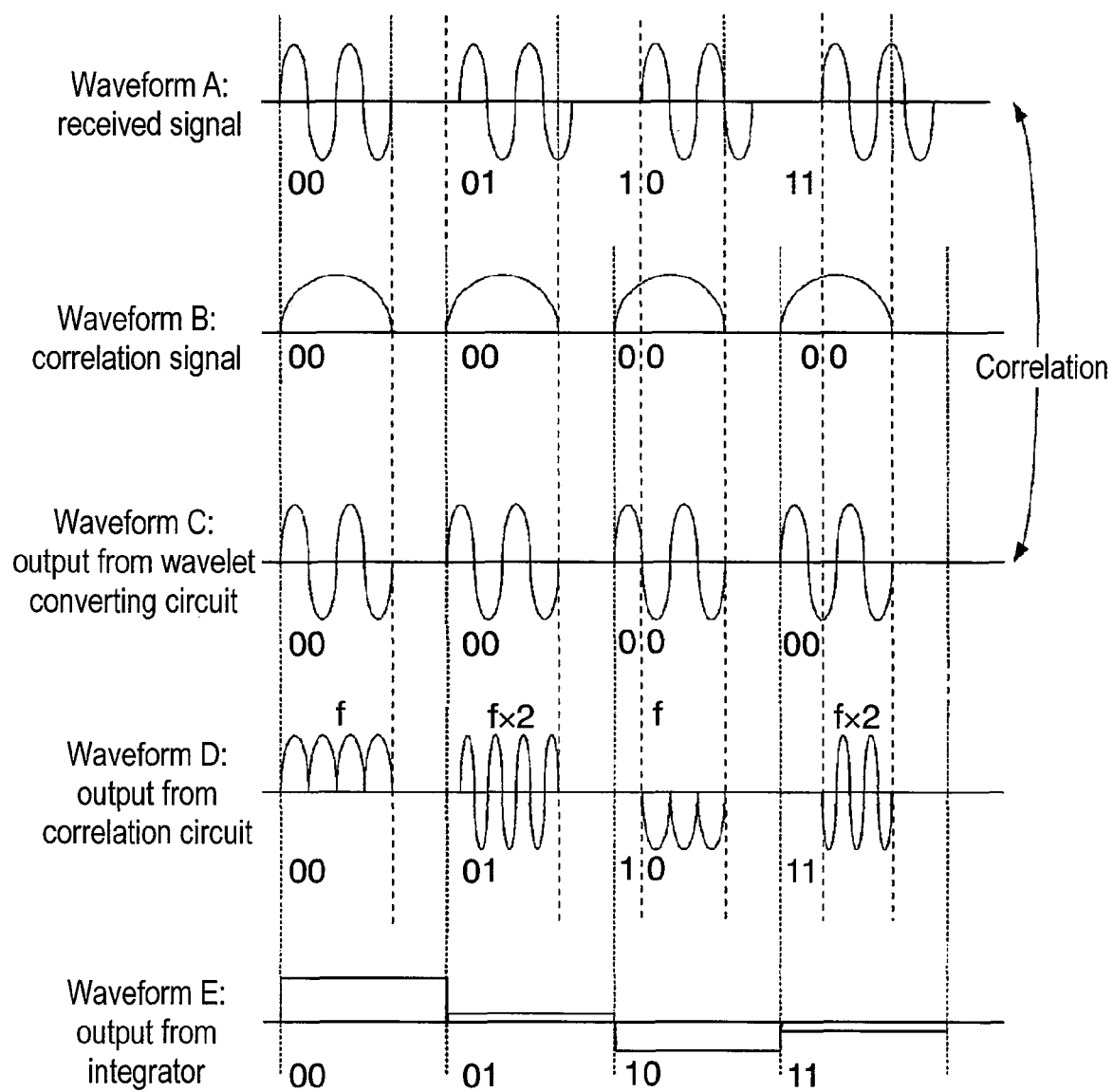
FIG. 25 shows waveforms in the receiving apparatus in accordance with this exemplary embodiment.
Figure 26:
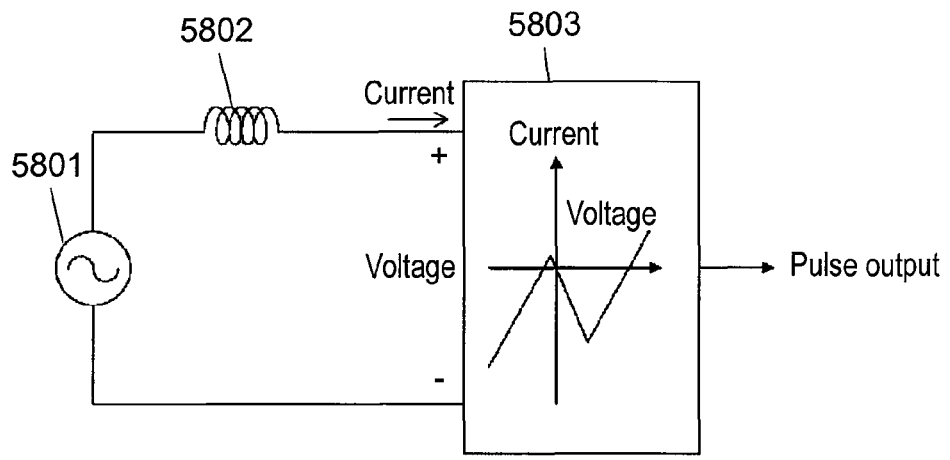
FIG. 26 is a block diagram showing a configuration of a wavelet generating part of a conventional modulating circuit.
Figure 27:
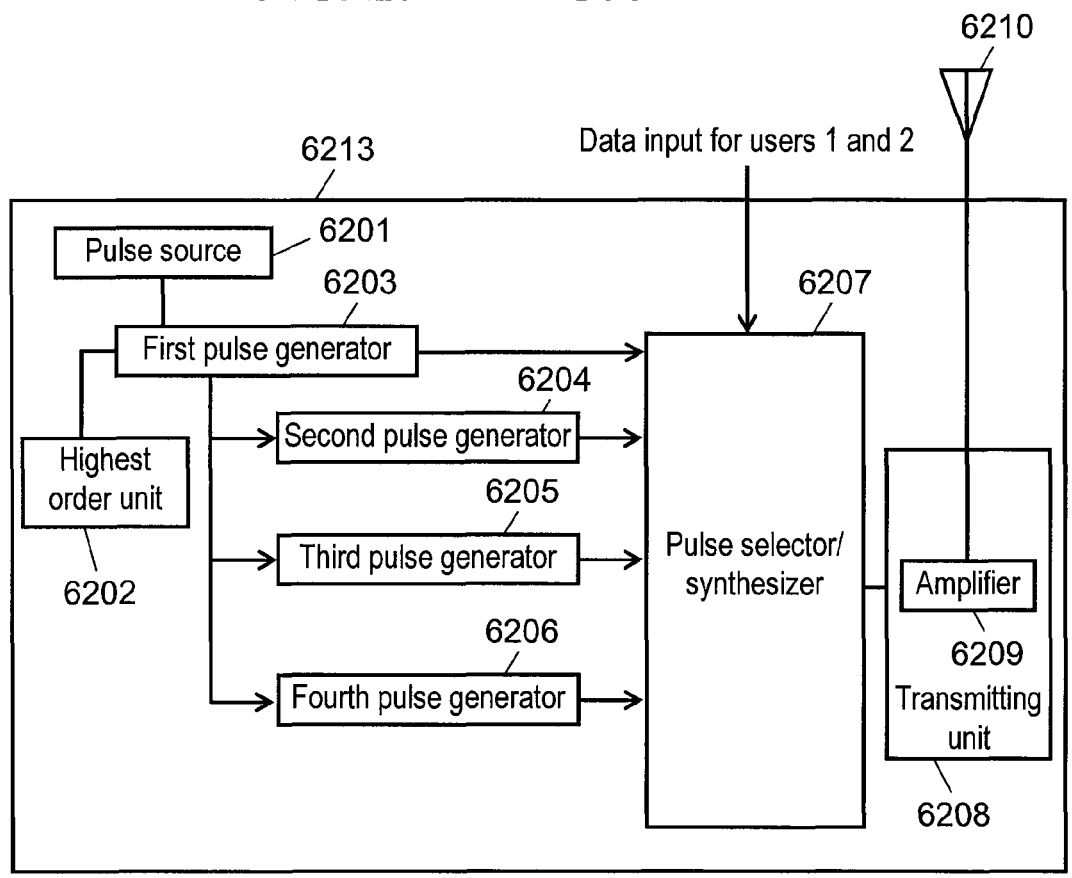
FIG. 27 is a block diagram showing a configuration of a conventional transmitting part.
Figure 28:
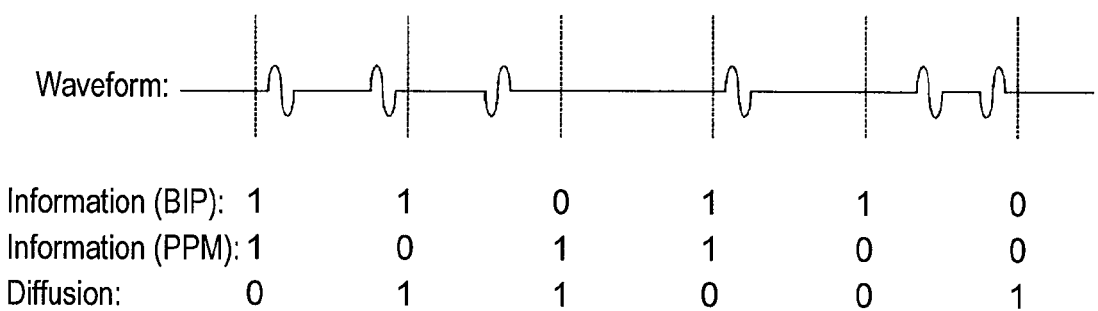
FIG. 28 shows a modulation waveform of a conventional transmitting apparatus.

FIG. 23 shows each waveform in each part of a receiving apparatus in accordance with an eighth exemplary embodiment. FIG. 24 is a block diagram showing a configuration of a PPM modulating circuit of a transmitting apparatus (not shown) for transmitting a signal to the receiving apparatus in accordance with this exemplary embodiment. FIG. 25 shows waveforms in the receiving apparatus in accordance with this exemplary embodiment. This exemplary embodiment is different from the fifth exemplary embodiment in that the wavelet positions at the PPM modulation time are provided in four places and that more pieces of information are transmitted by one wavelet.

A case where delay time τ applied in the PPM modulating circuit is τ=T/2 with respect to period T in the central frequency of the wavelet provided by the waveform converting circuit is described. The output waveform in each part of the receiving apparatus in this exemplary embodiment is described with reference to FIG. 23. The received signal is a four-valued PPM modulation signal that has been converted into a wavelet (three-period sine wave in this exemplary embodiment) in the transmitting apparatus as shown in waveform A in FIG. 23. The correlation signals are generated at the timing of "00" of the PPM modulation signal as shown in waveform B in FIG. 23. The correlation signal is waveform-converted in a waveform converting circuit (not shown) and converted into three-period sine wave as shown in waveform C in FIG. 23.

An output signal of a correlation circuit (not shown) is a signal shown in waveform D in FIG. 23. When this signal is integrated by an integrator (not shown), a signal having different polarities between "00" and "10" and "01" and "11" is output as shown in waveform E in FIG. 23. A signal having voltage values whose absolute values are different between "00" and "10" and between "01" and "11" is output. When an appropriate voltage value is employed as a reference, it is possible to discriminate "00," "01", "10," and "11" and extract received data.

In the PPM modulating circuit shown in FIG. 24, data-converted data are firstly converted into parallel data in serial-parallel converting (hereinafter, referred to as S/P converting) circuit 902. When the input data are assumed to be, for example, "0101101100 . . . ," since the four-valued PPM modulation is carried out in this exemplary embodiment, the data are divided into two values each as in "01|01|10|11| 00| . . . " Then, the first information and the second information are controlled individually. The first information is input into delay device 903 as a control signal and the second information becomes a control signal of delay device 904. A clock signal as a transmission signal is input into delay devices 903 and 904, respectively. When control signal 0 is input, the signal is output so that it is delayed by a delay time 0. When control signal 1 is input, the signal is output so that it is delayed by an arbitrary delay time. In this exemplary embodiment, the delay time by delay device 903 is two times as that of delay device 904.

In the above description, a configuration of PPM modulation, in which modulation is carried out in four wavelet positions, is described. However, for example, eight-valued, 16-valued, and further multi-valued modulation can be carried out by the similar configuration.

With reference to FIG. 25, a case where delay time τ applied in the PPM modulating circuit shown in FIG. 24 is made to be τ=T/4 with respect to period T in the central frequency of the wavelet signal provided in the waveform converting circuit is described. That is to say, four-valued phase modulation is described.

As shown in waveform A in FIG. 25, the received signal is a received four-valued PPM modulation signal that has been converted into a wavelet signal and transmitted by the transmitting apparatus. The correlation signal is generated at, for example, the timing of "00" as shown in waveform B in FIG. 25. The correlation signals are waveform-converted in a waveform converting circuit (not shown) so as to output a signal shown in waveform C in FIG. 25. The output signal of a correlation circuit (not shown) is a signal shown in waveform D in FIG. 25. When this signal is integrated by an integrator (not shown), a signal having different polarities between "00" and "10" and "01" and "11" is output as shown in waveform E in FIG. 25. Signals having voltage values whose absolute values are different between "00" and "10" and between "01" and "11". When an appropriate voltage value is employed as a reference, it is possible to discriminate "00," "01", "10," and "11" so as to extract received data.

At this time, signals of "00" and 01" are discriminated based on being plus voltage and "10" and 11" are discriminated based on being minus voltage. Discrimination between signals "00" and "01" and between "10" and "11" may be carried out based on whether the frequency of the output signal is f×2 or not.

In the receiving method of this exemplary embodiment, even when modulation is not known in the receiving apparatus, for example, even when T/2 and T/4 are mixed as the position modulation of the transmitting apparatus, the receiving apparatus can demodulate received signals by generating a correlation signal at a constant period.

As mentioned above, according to the receiving apparatus in the eighth exemplary embodiment of the present invention, wavelets can be easily separated and communication speed can be improved.

INDUSTRIAL APPLICABILITY

As mentioned above, a pulse wireless apparatus in accordance with the present invention is useful in providing a wireless apparatus capable of carrying out PPM modulation or Bi-Phase modulation simultaneously and excellent in mass production in a small size and at a low cost. A transmitting apparatus, a receiving apparatus and a communication system of the present invention have an advantage that the transmitting apparatus can easily generate a desired waveform even for any very short wavelets and can be provided in a small size, with low power consumption and at a low cost; and the receiving apparatus can separate wavelets and can easily improve the communication speed. The transmitting apparatus, a receiving apparatus and a communication system of the present invention are useful as a transmitting apparatus, a receiving apparatus and a communication system using a broad band signal such as a wavelet waveform.

The invention claimed is:

1. A modulating circuit comprising:
a clock generating part that generates a clock signal at a predetermined time interval;
a transmission signal generating part that generates a transmission signal at the predetermined time interval;
a control signal generating part that outputs a control signal having a predetermined duration based on the clock signal;
a delay part receiving the control signal and generates a delayed signal that has been delayed by a delay amount based on the transmission signal or the control signal based on the transmission signal; and
a wavelet generating part that generates a wavelet at generation timing of the delayed signal or the control signal,
wherein the delay part includes a delay element that delays the control signal to produce the delayed signal and a first switch circuit that switches between the delayed signal and the control signal in response to the transmission signal.

2. A transmitting apparatus comprising:
a clock generating part that generates a clock signal at a predetermined time interval;
a transmission signal generating part that generates a transmission signal at the predetermined time interval;
a control signal generating part that outputs a control signal having a predetermined duration based on the clock signal;
a delay part receiving the control signal and generates delayed signal that has been delayed by a delay amount based on the transmission signal or the control signal based on the transmission signal; and
a wavelet generating part that generates a wavelet at generation timing of the delay signal,
wherein the delay part includes a delay element that delays the control signal to produce the delayed signal and a first switch circuit that switches between the delayed signal and the control signal in response to the transmission signal,
wherein a wireless communication is carried out so that a width of the wavelet is increased when a long distance communication is required and the width of the wavelet is reduced when reduction of power consumption is required.

3. A transmitting apparatus comprising:
a clock generating part that generates a clock signal at a predetermined time interval;
a transmission signal generating part that generates a transmission signal at the predetermined time interval;

a control signal generating part that outputs a control signal having a predetermined duration based on the clock signal;

a delay part receiving the control signal and generates a delayed signal that has been delayed by a delay amount based on the transmission signal or the control signal based on the transmission signal; and a wavelet generating part that generates a wavelet at generation timing of the delay signal, wherein the delay part includes a delay element that delays the control signal to produce the delayed signal and a first switch circuit that switches between the delayed signal and the control signal in response to the transmission signal, wherein a wireless communication is carried out so that a width of the wavelet is increased when synchronization at an initial stage of communication is established and the width of the wavelet is reduced when a data transmission is carried out after the synchronization is established.

4. The transmitting apparatus of claim 3 further comprising:

a transmission output part that transmits a signal from the modulating circuit, wherein the modulating circuit is a pulse position modulating circuit that makes a position change of a wavelet with a time shorter than a width of the wavelet.

5. The transmitting apparatus of claim 4, wherein a waveform converting circuit that converts wireless communication data into a wavelet is disposed in front of or behind the pulse position modulating circuit.

6. The transmitting apparatus of claim 5, wherein the waveform converting circuit has any of configurations of:

a configuration including a differentiating circuit that differentiates an input signal and a multiplying circuit that multiplies the input signal;

a configuration including at least one or more wavelet generating circuits that generates a wavelet and a second switch circuit that switches signals from the at least one or more wavelet generating circuits, and outputting a signal from the second switch circuit when a signal from the pulse position modulating circuit is input;

a configuration including at least one or more wavelet generating circuits that generate a wavelet and a mixing circuit that mixes signals from the at least one or more wavelet generating circuits, and outputting a signal from the mixing circuit when the signal from the pulse position modulating circuit is input; and a configuration including a wavelet generating circuit that generates a wavelet and enabling a start and a termination of oscillation to be directly controlled, and outputting a signal from the wavelet generating circuit when a signal from the pulse position modulating circuit is input.

7. The transmitting apparatus of claim 5, wherein the waveform converting circuit includes a waveform shaping circuit that shapes a waveform and an output of the waveform converting circuit is a waveform that has passed through the waveform shaping circuit.

8. The transmitting apparatus of claim 5, wherein a position change time applied in the pulse position modulating circuit is an odd multiple of ½ period of a period in a central frequency of the wavelet of the waveform converting circuit.

* * * * *